United States Patent
Abacioglu et al.

(10) Patent No.: US 10,260,317 B2
(45) Date of Patent: Apr. 16, 2019

(54) AUTOMATED GENERATION OF LOCAL GRID REFINEMENT AT HYDRAULIC FRACTURES FOR SIMULATION OF TIGHT GAS RESERVOIRS

(71) Applicant: BP Corporation North America Inc., Houston, TX (US)

(72) Inventors: Yafes Abacioglu, Sugar Land, TX (US); Harun Ates, Katy, TX (US); Herbert Sebastian, Cypress, TX (US)

(73) Assignee: BP Corporation North America Inc., Houston, TX (US)

( * ) Notice: Subject to any disclaimer, the term of this patent is extended or adjusted under 35 U.S.C. 154(b) by 1917 days.

(21) Appl. No.: 13/621,458

(22) Filed: Sep. 17, 2012

(65) Prior Publication Data

US 2013/0073268 A1    Mar. 21, 2013

Related U.S. Application Data

(60) Provisional application No. 61/536,943, filed on Sep. 20, 2011.

(51) Int. Cl.
*E21B 41/00* (2006.01)
*G01V 11/00* (2006.01)
*G06F 17/10* (2006.01)

(52) U.S. Cl.
CPC .......... *E21B 41/0092* (2013.01); *G01V 11/00* (2013.01); *G06F 17/10* (2013.01)

(58) Field of Classification Search
None
See application file for complete search history.

(56) References Cited

U.S. PATENT DOCUMENTS

| | | | |
|---|---|---|---|
| 8,682,628 B2* | 3/2014 | Bowen | E21B 49/00 702/6 |
| 2010/0017181 A1 | 1/2010 | Mouton et al. | |
| 2010/0299125 A1 | 11/2010 | Ding et al. | |

OTHER PUBLICATIONS

Cipolla et al., "Modeling Well Performance in Shale-Gas Reservoirs", 2009 SPE/EAGE Reservoir Characterization and Simulation Conference, Oct. 2009, pp. 1-16.*

(Continued)

*Primary Examiner* — Saif A Alhija
(74) *Attorney, Agent, or Firm* — John Wood

(57) ABSTRACT

A computer system and method of automatically generating a Local Grid Refinement (LGR) gridded model of a gas reservoir. A geologic file includes information identifying the locations of one or more wells according to root grid cells within a volume of the earth to be modeled. User inputs specify the number of hydraulic fractures from each well, and such parameters as the fracture length, etc. User inputs also specify the number of "splits" of the root grid cells containing hydraulic fractures; those root grid cells are then split into finer resolution grid cells of increasing width within the root grid cells containing the fractures. For horizontal wells, user inputs indicate the number of splits of root grid cells containing the lateral portions of the wellbore. Non-orthogonal and complex fractures are processed by a "nested" LGR approach. Geologic properties are assigned to each grid cell, with a tensorial adjustment included for non-orthogonal fractures, and the resulting model is available for simulation.

26 Claims, 18 Drawing Sheets

(56) References Cited

OTHER PUBLICATIONS

Jramirez et al., "Multiscale Compositional Simulation of Naturally Fractured Reservoirs", SPE 113651, Jun. 9-12, 2008, XP-002689110, Rome, Italy, 10 pages.
J.R. Natvig and B. Skaflestad: "Multiscale Mimetic Solvers for Efficient Streamline Simulation of Fractured Reservoirs", SPE Reservoir Simulation Symposium, 119132, Feb. 2, 2009, pp. 1-09, XP002689110, The Woodlands, Texas, USA.
PCT Search Report dated Jan. 7, 2013, in international application No. PCT/US2012/055724, 12 pages.

* cited by examiner

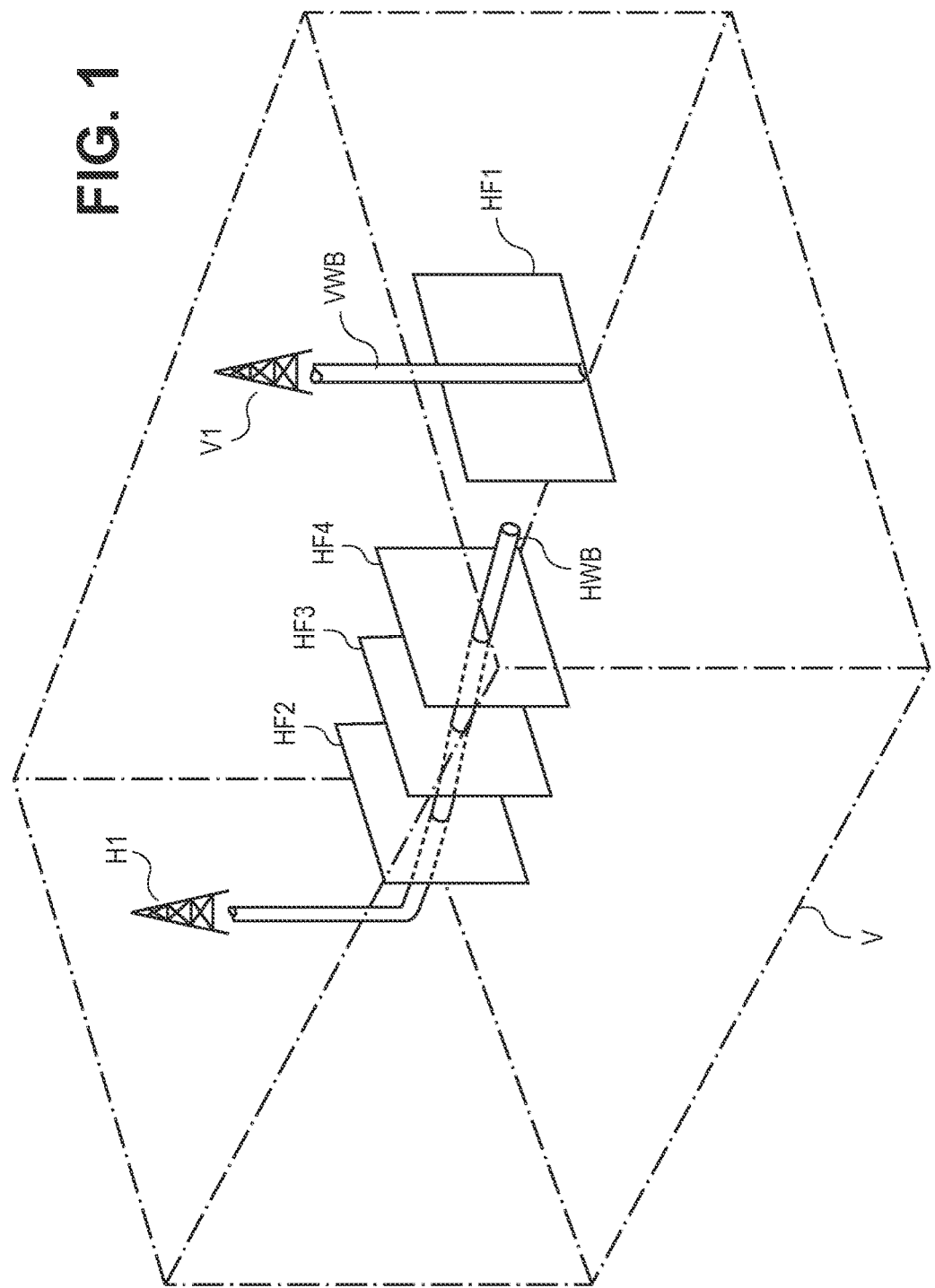

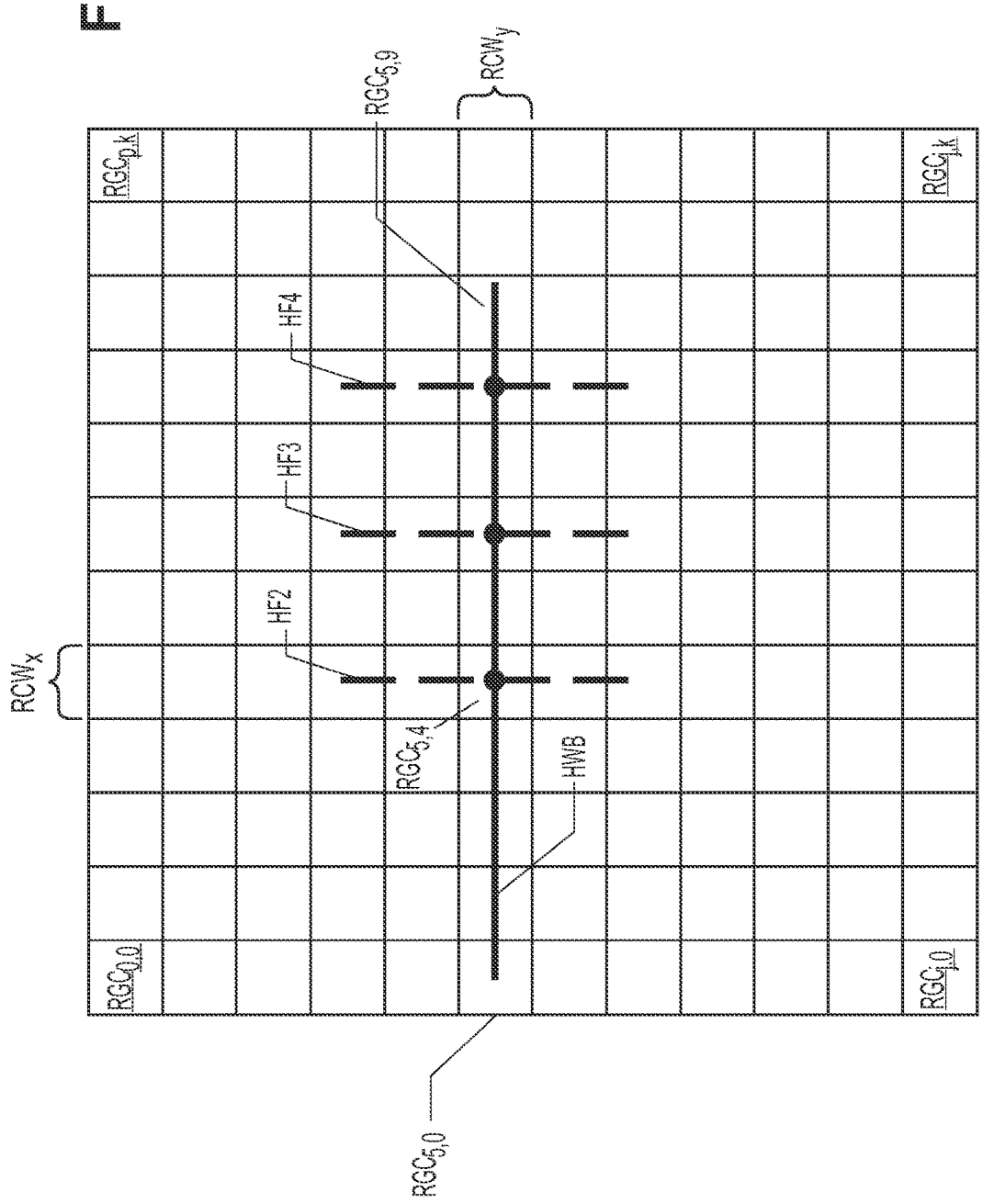

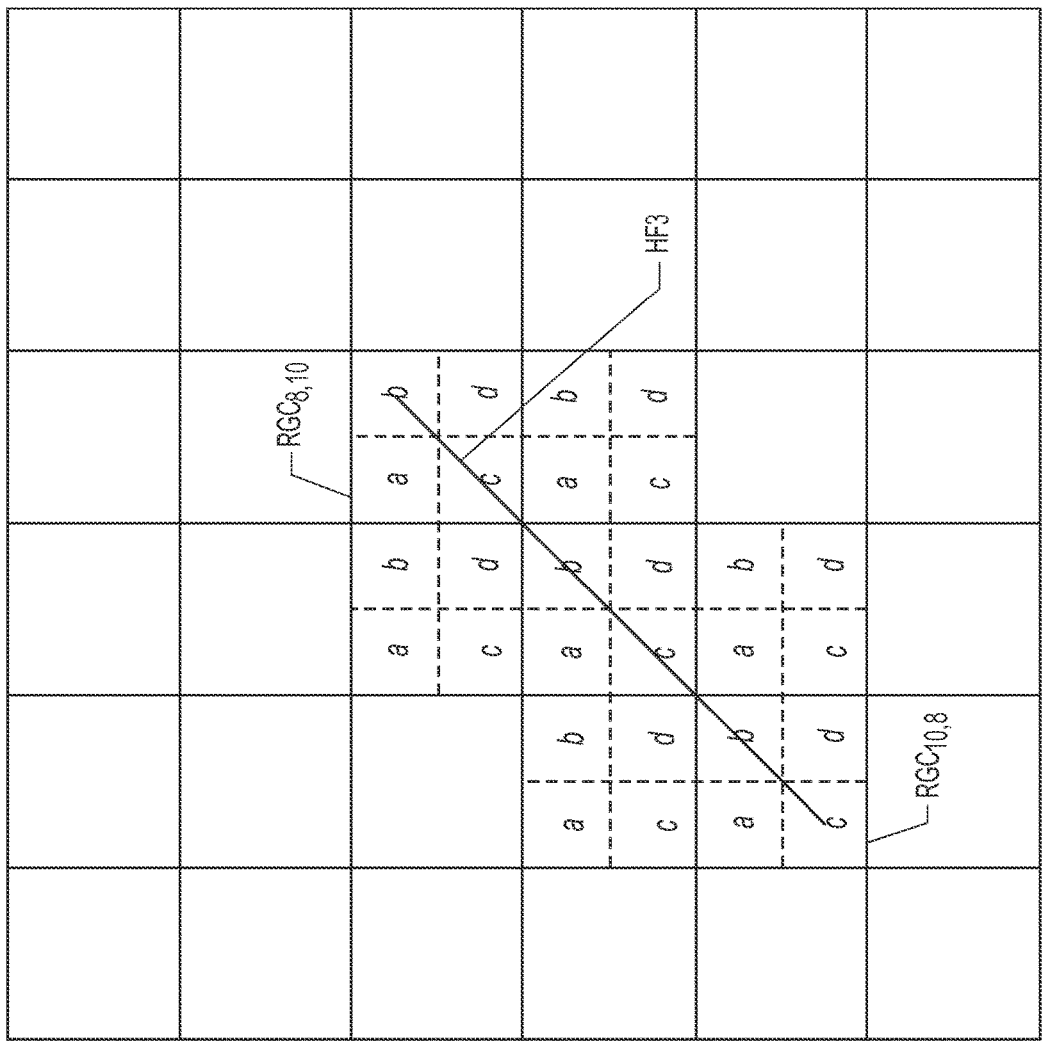

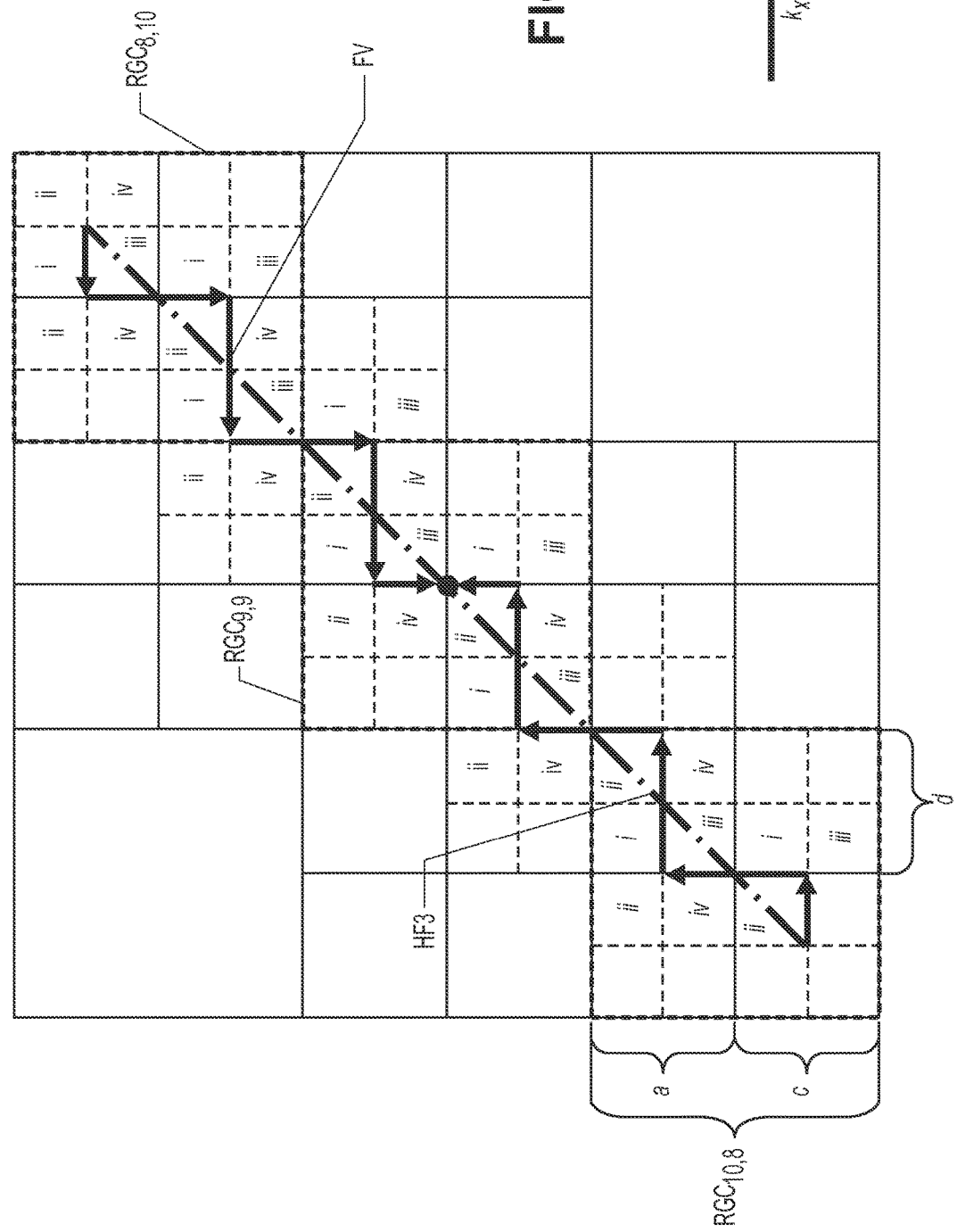

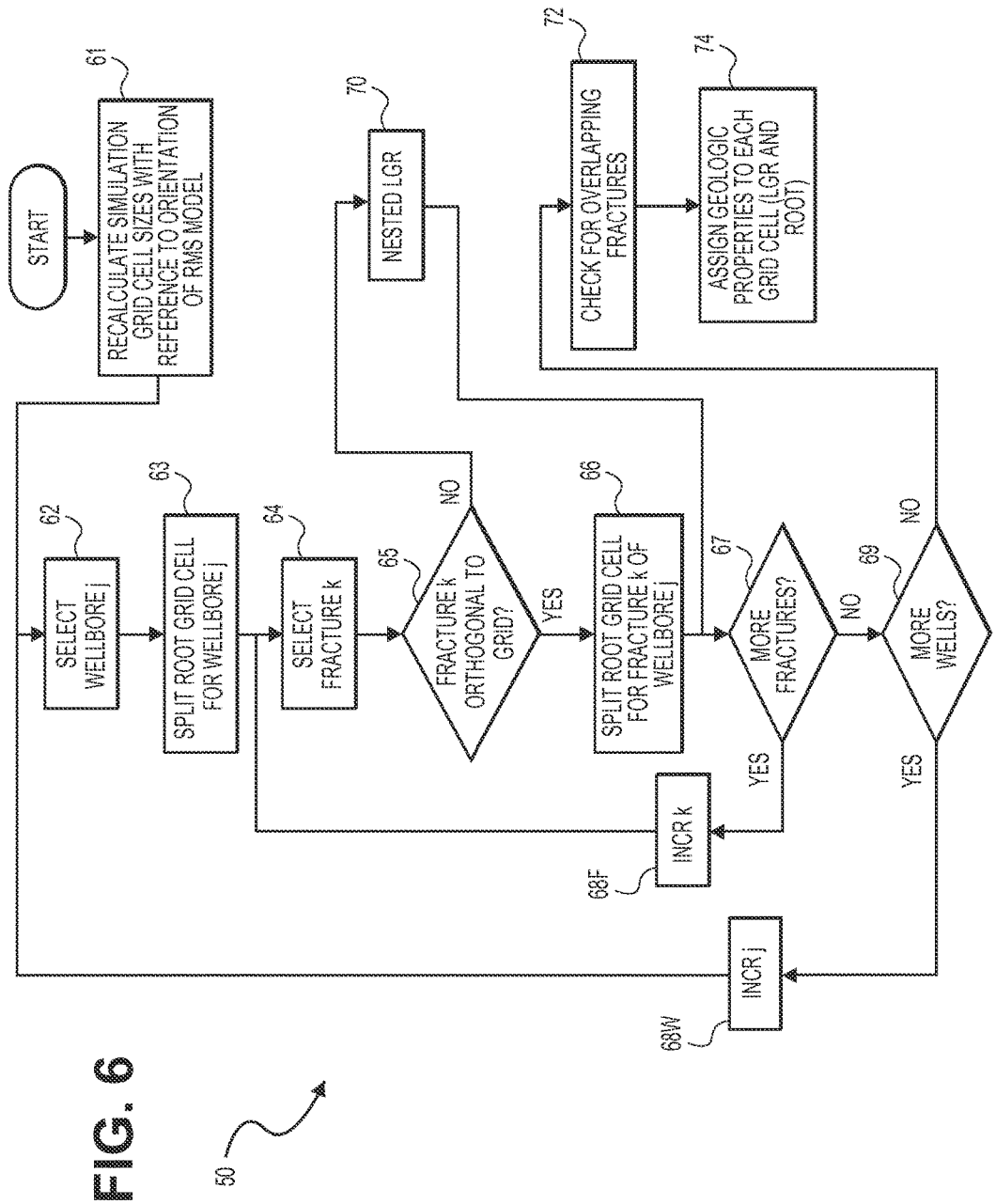

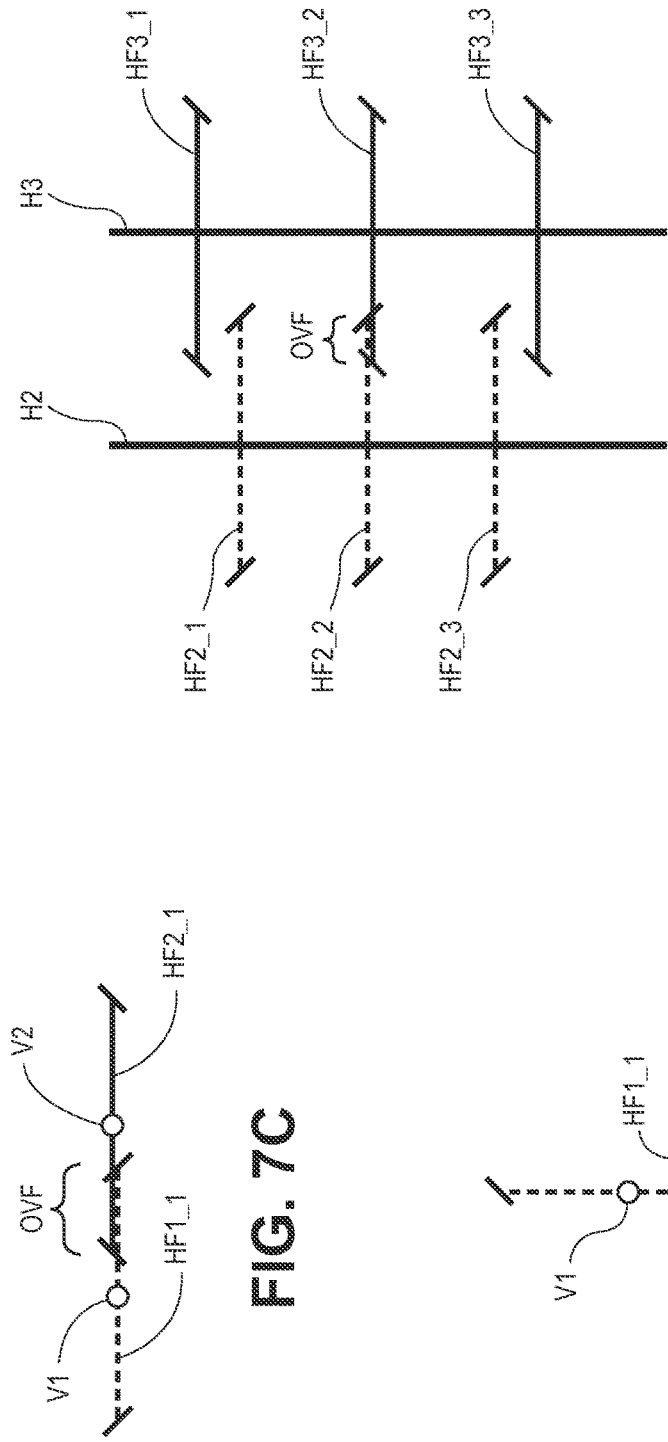
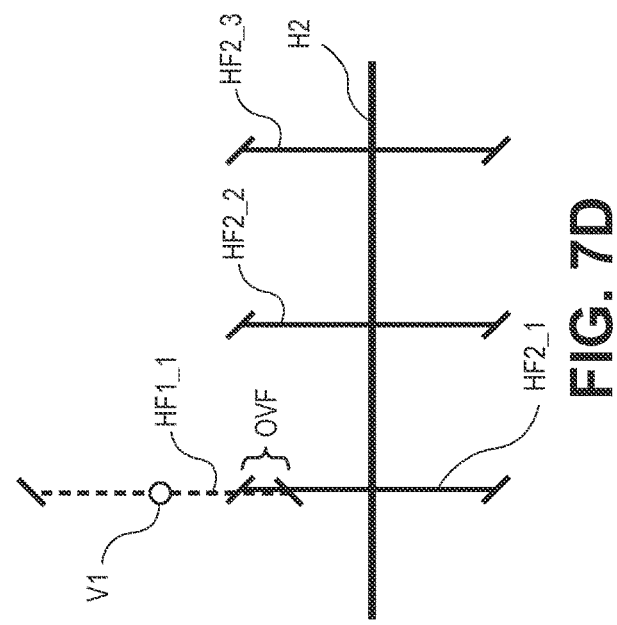

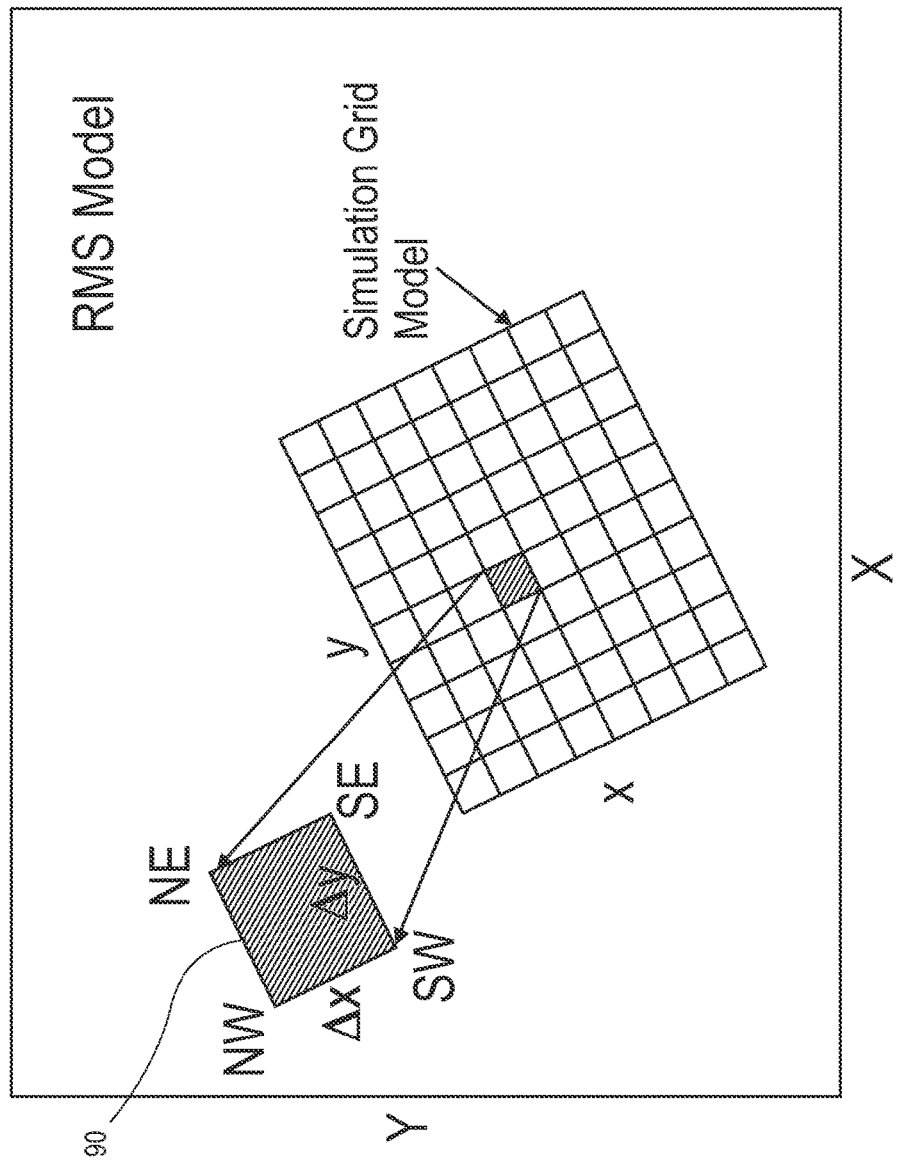

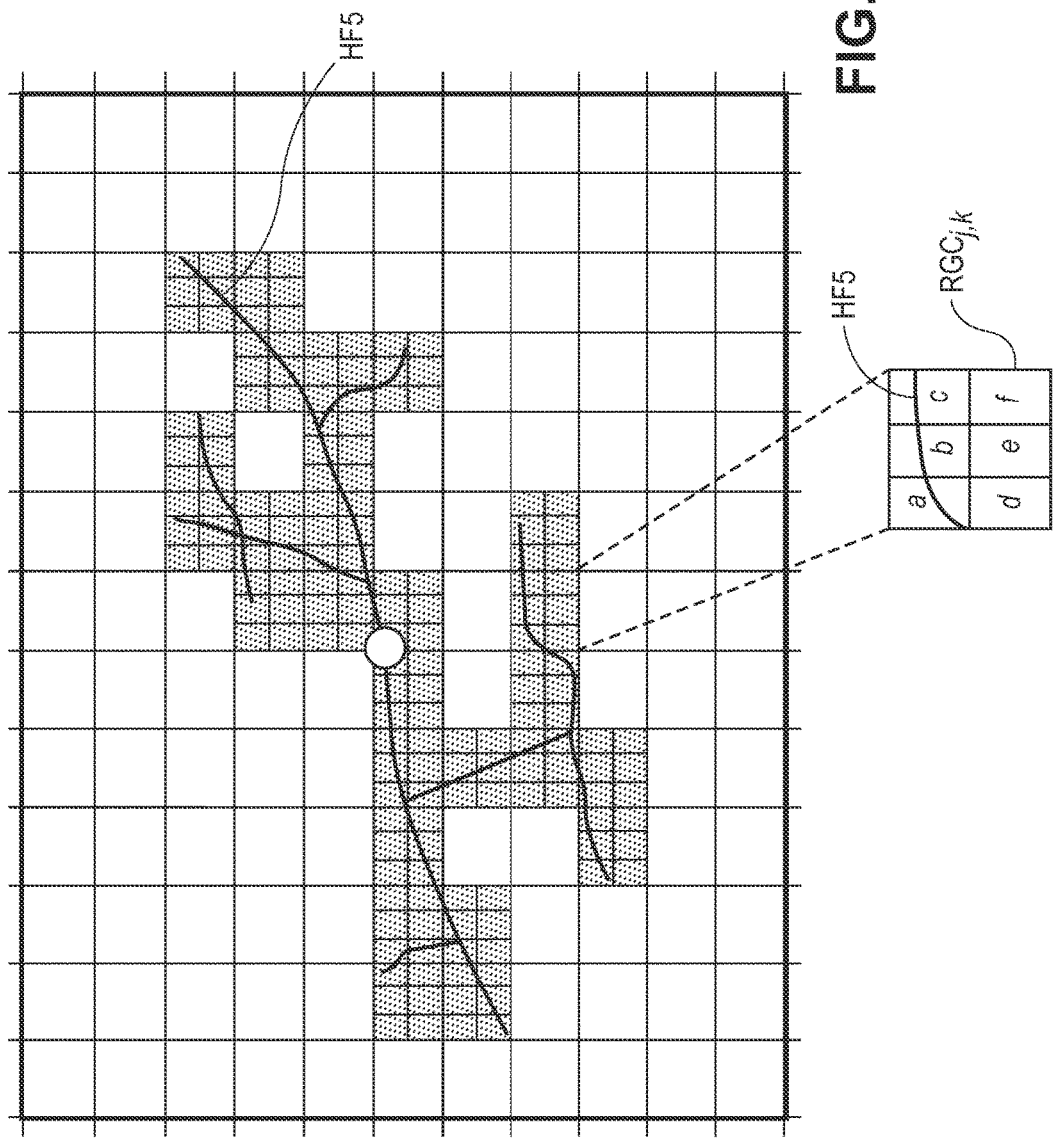

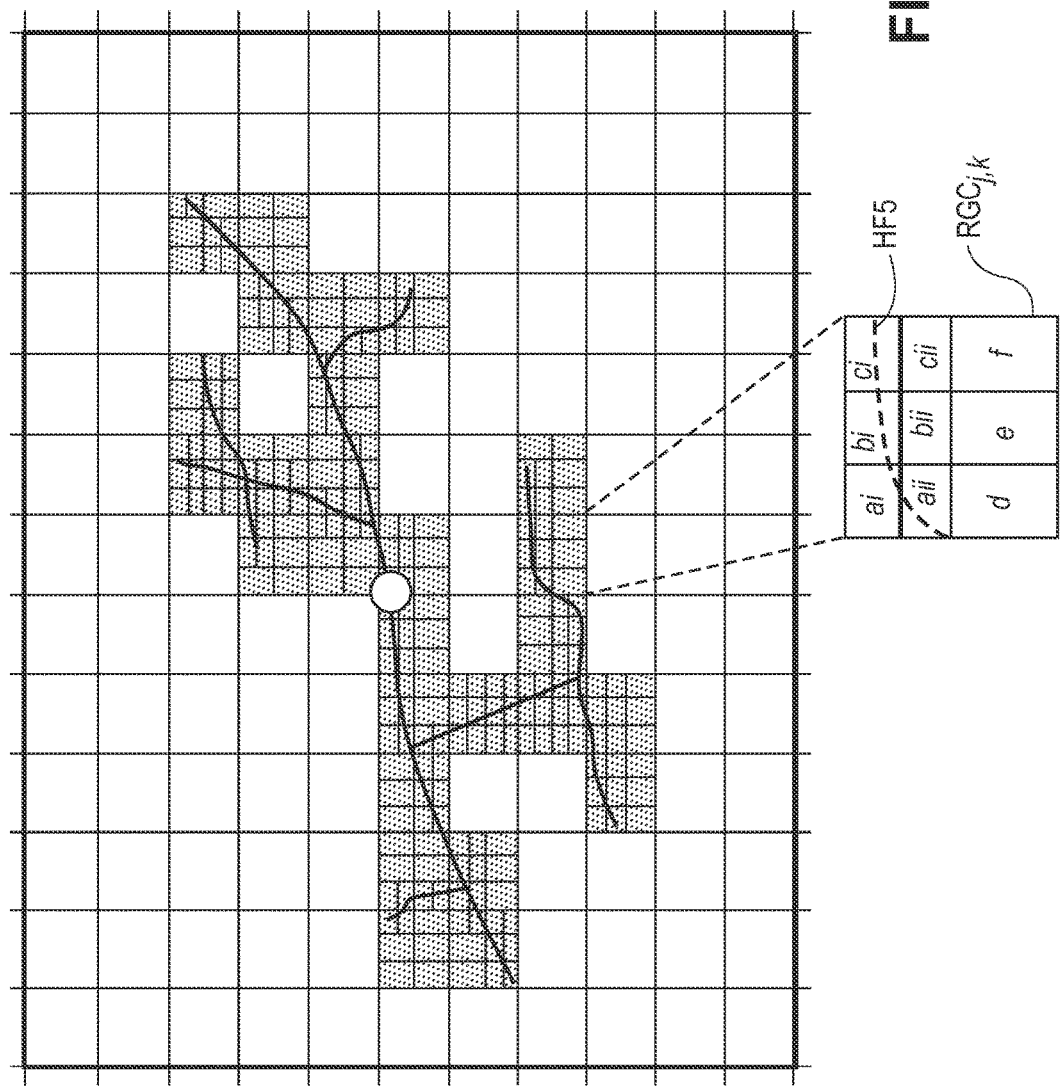

AUTOMATED GENERATION OF LOCAL GRID REFINEMENT AT HYDRAULIC FRACTURES FOR SIMULATION OF TIGHT GAS RESERVOIRS

CROSS-REFERENCE TO RELATED APPLICATIONS

This application claims priority, under 35 U.S.C. § 119(e), of U.S. Provisional Application No. 61/536,943, filed Sep. 20, 2011, incorporated herein by reference in its entirety for all purposes.

STATEMENT REGARDING FEDERALLY SPONSORED RESEARCH OR DEVELOPMENT

Not applicable.

BACKGROUND

This invention is in the field of oil and gas production. Embodiments of this invention are more specifically directed to the production performance analysis of wells for purposes of well and reservoir management.

The current economic climate emphasizes the need for optimizing hydrocarbon production. Such optimization is important considering that the costs of drilling of new wells and operating existing wells are high by historical standards, largely because of the extreme depths to which new producing wells must be drilled and because of other physical barriers to discovering and exploiting reservoirs. These high economic stakes demand operators to devote substantial resources toward effective management of oil and gas reservoirs, and effective management of individual wells within production fields.

As is well known in the modern oil and gas industry, large reservoirs of natural gas yet remain in so-called "tight" formations, in which the flow of gas into a production well is greatly restricted by the nature of the gas-bearing rock. These low permeability formations include tight sands, gas shales and gas coals. Gas shale, for example, is relatively old (e.g., Paleozoic) rock, in which the porosity and permeability has been greatly reduced over time due to compaction, cementation, recrystallization, and chemical changes over time. Permeability of gas shales and other tight reservoir rocks can be as low as in the nanodarcy range. Even though a large amount of gas is retained in the earth in these tight formations, the extremely low permeability of these formations results in very low gas production, because the low permeability restricts the rate at which formation gas away from the wellbore can travel to perforations of conventional production wells.

Hydraulic fracturing ("fracing" or "fracking") of the formation around a wellbore is a common technique for increasing production from these tight gas formations. Typical hydraulic fracturing involves the pumping of fluid, typically water and often some chemicals, under pressure through the wellbore and into the formation. The pressure of the fluid, along with the chemical action of any chemical additives present in the fluid, cause the surrounding formation to fracture, with the line of the fracture extending from the wellbore at each perforation. The crack created by the fracture can extend on the order of hundreds of feet from the wellbore, but is typically quite narrow. Proppants, in the form of particles of silicas or sands of a selected size and composition, are typically pumped into the fracture via the wellbore, to ensure that the fracture does not close upon release of the fluid pressure. The fractures thus extend the reach of the wellbore into the formation, by providing one or more paths of high gas conductivity for a significant distance from the wellbore into the formation.

In many modern tight gas formations such as gas shales, the combination of horizontal drilling with hydraulic fracturing has proven beneficial. Horizontal wellbores can extend for a mile or more within the gas shale. In addition, because the gas shale and sand properties are generally anisotropic from the standpoint of internal strain, the drilled path will generally travel into the shale along a direction of least strain, facilitating both the penetration rate and also the eventual production following fracing.

As in any production field, the optimization of gas production from a tight gas reservoir involves decisions regarding the number and placement of wells, including whether to add or shut-in wells. In particular, well spacing in the development of a tight gas field is especially important, given the significant drilling cost typically associated with these reservoirs, and also considering the relative difficulty of obtaining good production from tight gas formations. In conventional (i.e., non-tight) reservoirs, a single well will produce from a relatively large portion of the reservoir, such that an additional well placed near an existing production well may not significantly increase production over the life of the reservoir. Conversely, because wells in tight gas formations produce from a much smaller projected region, close well spacing may be desirable to optimally produce from such gas bearing formation. Knowledge of the reservoir and its behavior is important in determining the optimal well spacing in such a field.

In addition, secondary and tertiary recovery operations, for example involving the injection of water or gas into the reservoir, involve decisions regarding whether to initiate or cease such operations, how many wells are to serve as injection wells, and where to place those wells in the field. Some wells may require well treatment, such as additional fracturing of the wellbore if drilling and production activity have plugged the wellbore surface to the extent that production has slowed. In some cases, production may be improved by shutting-in one or more wells for an extended period of time, in which case the optimization of production may require reconfiguring the entire production field. All of these actions are performed with an eye toward maximizing production at minimum cost. As evident from these examples, the optimization of a production field is a complex problem, involving many variables and presenting many choices.

The manner in which downhole pressure and flow rate evolve over time provides insight into the reservoir pressure in the region around the well. Reservoir pressure is an important parameter in understanding the reservoir and how to optimize production, because the rate at which gas will flow into the wellbore downhole (and thus out of the well at the surface) strongly depends on the difference between the reservoir pressure and the back pressure exerted by the fluid in the wellbore. Over time, the volume of gas drawn out of the well will generally reduce the reservoir pressure, and the rate of production will fall.

Despite all of the limitations to measurement of reservoirs and sub-surface properties, reservoir management decisions must still be made, and therefore will be made using the best available yet incomplete understanding of the structure of the reservoir. As mentioned above, these reservoir management decisions include whether and where to place additional production wells, whether and where to inject gas or other substances for secondary recovery operations, and the like. Well management decisions, such as whether, when, and how to work over an existing production well to improve its production output, must also be made, even if based on a limited understanding of the reservoir. And, of course, short-term and long-term economic analysis of the reservoir is also important to the operator and the financial backers of the project.

In order to make these decisions, reservoir engineers commonly develop models of reservoir behavior. Conventional reservoir models are based on seismic and other geological surveys of the production field, along with conclusions that can be drawn from well logs, pressure transient analysis, and the like. These models are applied to conventional reservoir "simulator" computer programs, by way of which the reservoir engineer can analyze the behavior of the reservoir under production conditions, and by way of which the engineer can simulate the behavior of the reservoir in response to potential reservoir management actions (i.e., "what-if" analysis). Some reservoir simulators approximate fluid flow in the reservoir on a grid of geometric elements, and numerically simulate fluid flow behavior using finite-difference or finite-element techniques to solve for pressure and flow conditions within and between elements in the grid. Simulation of the reservoir behavior is then attained by stepping in time and evolving the inter-element flows and the pressures at each grid element over a sequence of the time steps.

The use of finite-difference modeling to simulate the behavior of a relatively large production field over time utilizes the "gridding" of the three-dimensional subsurface volume into incremental volume blocks, or cells, within the overall grid. In a typical model for fluid flow in the subsurface, rock properties pertaining to fluid conductivity are assigned to each grid cell. Examples of these properties include porosity and permeability, as based on core samples, well logs, and seismic survey data. The model is constructed from one or more functions for expressing flow out of the cell as a function of flow into the cell, and for expressing the fluid pressure within the cell. These functions in the model can then be solved simultaneously, given a set of initial conditions, using conventional computer simulation programs. Simulations of production over time from one or more wells penetrating the modeled reservoir, and of pressure distribution within the modeled reservoir over time, can lend insight into the expected behavior of the reservoir, and can evaluate various options in maximizing the production from the reservoir. For example, the economic benefit of placing a new production well at a particular location can be evaluated by way of such a simulation. The effects of other actions, such as shutting-in wells, initiating secondary recovery activities, re-working wells, etc. can similarly be evaluated.

Finite-difference models of relatively large production fields of even modest complexity can become quite large, in the number of grid cells. The computational complexity and cost of simulating the behavior of models including large numbers of grid cells can be prohibitive, even with modern high performance computer systems. As such, it is useful to reduce the number of grid cells in the model, by increasing the volume of each grid cell. For example, a typical grid cell in a reasonably manageable finite-difference model of a large production field may be on the order of 100 feet on a side. Conventional models assume the assigned properties (e.g., porosity, permeability) to be constant within each grid cell, to avoid higher-order computations.

Conventional commercially available reservoir simulation computer program packages include the VIP® reservoir simulation suite available from Halliburton, and NEXUS® reservoir simulation software, also available from Halliburton.

However, it has been observed that finite-difference models are not particularly useful to simulate the behavior of tight gas formations using conventional simulation software packages. In these tight gas formations of extremely low permeability, reservoir pressure can change dramatically within relatively small distances, such as on the order of one foot or less. The width of fractures caused by hydraulic fracturing can be even smaller yet, for example on the order of 0.1 inches. Because of these high pressure gradients over close distances in tight gas formations, the relatively coarse grid cells typically used for large scale reservoir modeling are thus generally inaccurate. However, dramatic reduction in the size of grid cells throughout the entire reservoir will render the computational burden unrealistic.

Local grid refinement ("LGR") is a known technique for defining grid cells as useful in finite-difference modeling. In a general sense, LGR defines fine grid cells of small size in some regions of the overall modeled volume with coarse grid cells of larger size defining other regions of the volume. For example, use of LGR in reservoir modeling has involved defining fine grid cells in the near wellbore region of a single fractured horizontal well location, in order to derive corrections for transmissibility as applied to the overall coarse grid cell model. The coarse grid cell model and fine grid cell model otherwise tend to deviate at early simulation times. The reservoir can then be modeled using coarse grid cells, to which the transmissibility corrections derived from the fine grid cells are applied, to accurately simulate production from such a well.

BRIEF SUMMARY

Embodiments provided herein include methods and systems for modeling tight gas reservoirs that permits for high resolution simulation of behavior near the wellbore with reasonable computational complexity and cost.

Embodiments provided herein include a method and system that is capable of accurately modeling vertical and horizontal wells at which hydraulic fracturing has been performed.

Embodiments provided herein include a method and system that is readily scalable to complex production fields with large numbers of wells.

Embodiments provided herein include such a method and system that efficiently enables the accurate simulation of a tight gas production field to optimize development and productivity.

Other objects and advantages of embodiments provided herein will be apparent to those of ordinary skill in the art having reference to the following specification together with its drawings.

Provided herein is a computerized method and system for modeling the fluid and pressure behavior of the sub-surface at locations at which hydraulic fractures extend from a wellbore. The modeling system receives data indicating the size of the sub-surface to be modeled, and the number and direction of each of the wells in that volume, along with the number and properties of fractures extending from each of those wells. Data indicating the location of the fractures at vertical and horizontal wells, as the case may be, within a coarsely-gridded volume representative of the sub-surface to be modeled are also provided. Root grid cells surrounding the fracture and surrounding the wellbore are subdivided to improve the resolution of the model at those locations. For orthogonal fractures, the grid cells are split in the direction perpendicular to the fracture, with the grid cell nearest the fracture or wellbore being the smallest and adjacent cells increasing in size until the root grid cell boundary is reached. For non-orthogonal or complex fractures, those cells intersected by the fracture are sub-divided in area, and in subsequent levels of refinement, those sub-divisions intersected by the fracture are again sub-divided until the desired resolution near the fracture is attained. Rock properties such as porosity, permeability, etc. are applied to each grid cell (coarse and split), to prepare the model for simulation, with tensorial permeability adjustment applied if appropriate, such as in the case of non-orthogonal fractures.

Provided herein is a method of operating a computer system to simulate the fluid and pressure of a gas reservoir in a portion of the earth, the method comprising the steps of: providing a geologic model of the portion of the earth containing a gas reservoir, the geologic model specifying rock parameters at locations within that portion of the earth; identifying the locations of wellbores within the reservoir to be modeled relative to a grid, the grid defined by a plurality of root grid cells; receiving inputs indicating one or more fracture parameters pertaining to one or more hydraulic fractures at the wellbores, the fracture parameters including at least a length of each hydraulic fracture; operating the computer system to generate a Local Grid Refinement (LGR) gridded model of the portion of the earth containing the reservoir, by sub-dividing root grid cells intersected by a hydraulic fracture into sub-divisions of increasing size from an innermost sub-division including at least a portion of the hydraulic fracture; and operating the computer system to execute a reservoir simulation computer program.

Provided herein is a computer system for simulating the fluid and pressure of a gas reservoir in a portion of the earth, comprising: a processing unit for executing program instructions; a memory resource, coupled to the processing unit, for storing data representative of a geologic model specifying rock parameters at locations within a portion of the earth containing a gas reservoir, and data representative of the locations of wellbores in that portion of the earth; and program memory, coupled to the processing unit, for storing a computer program including program instructions that, when executed by the one or more processing units, is capable of causing the computer system to perform a sequence of operations comprising: identifying the locations of wellbores within the reservoir to be modeled relative to a grid, the grid defined by a plurality of root grid cells; receiving data indicating one or more fracture parameters pertaining to one or more hydraulic fractures at the wellbores, the fracture parameters including at least a length of each hydraulic fracture; generating a Local Grid Refinement (LGR) gridded model of the portion of the earth containing the reservoir, by sub-dividing root grid cells intersected by a hydraulic fracture into sub-divisions of increasing size from an innermost sub-division including at least a portion of the hydraulic fracture; and operating the computer system to execute a reservoir simulation computer program.

Provided herein is a non-transitory computer-readable medium storing a computer program that, when executed on a computer system, causes the computer system to perform a sequence of operations for simulating the fluid and pressure of a gas reservoir in a portion of the earth, the sequence of operations comprising: identifying the locations of wellbores within the reservoir to be modeled relative to a grid, the grid defined by a plurality of root grid cells; receiving data indicating one or more fracture parameters pertaining to one or more hydraulic fractures at the wellbores, the fracture parameters including at least a length of each hydraulic fracture; generating a Local Grid Refinement (LGR) gridded model of the portion of the earth containing the reservoir, by sub-dividing root grid cells intersected by a hydraulic fracture into sub-divisions of increasing size from an innermost sub-division including at least a portion of the hydraulic fracture; and operating the computer system to execute a reservoir simulation computer program.

BRIEF DESCRIPTION OF THE SEVERAL VIEWS OF THE DRAWING

FIG. 1 is a perspective cross-sectional view of a volume corresponding to a gas reservoir to be modeled and simulated according to embodiments of the invention.

FIGS. 2a and 2b are cross-sectional plan views of the volume of FIG. 1, illustrating the operation of embodiments of the invention applicable to orthogonally oriented fractures.

FIGS. 3a through 3e are cross-sectional views illustrating the operation of embodiments of the invention applicable to a non-orthogonally oriented fracture.

FIG. 6 is a flow diagram illustrating the operation of the system of FIG. 4 in generating a Local Grid Refinement (LGR) model of a gas reservoir, according to embodiments of the invention.

FIGS. 7c through 7e are schematic plan views illustrating overlapping fractures in the LGR as identified according to embodiments of the invention.

FIG. 7f is a cross-sectional view of a portion of the LGR gridded model constructed according to embodiments of the invention, and its relationship to a geologic model to be applied in a reservoir simulation.

FIGS. 9a through 9d are cross-sectional views illustrating the operation of embodiments of the invention applicable to a non-orthogonal complex fracture structure.

DETAILED DESCRIPTION

Figure 2B:
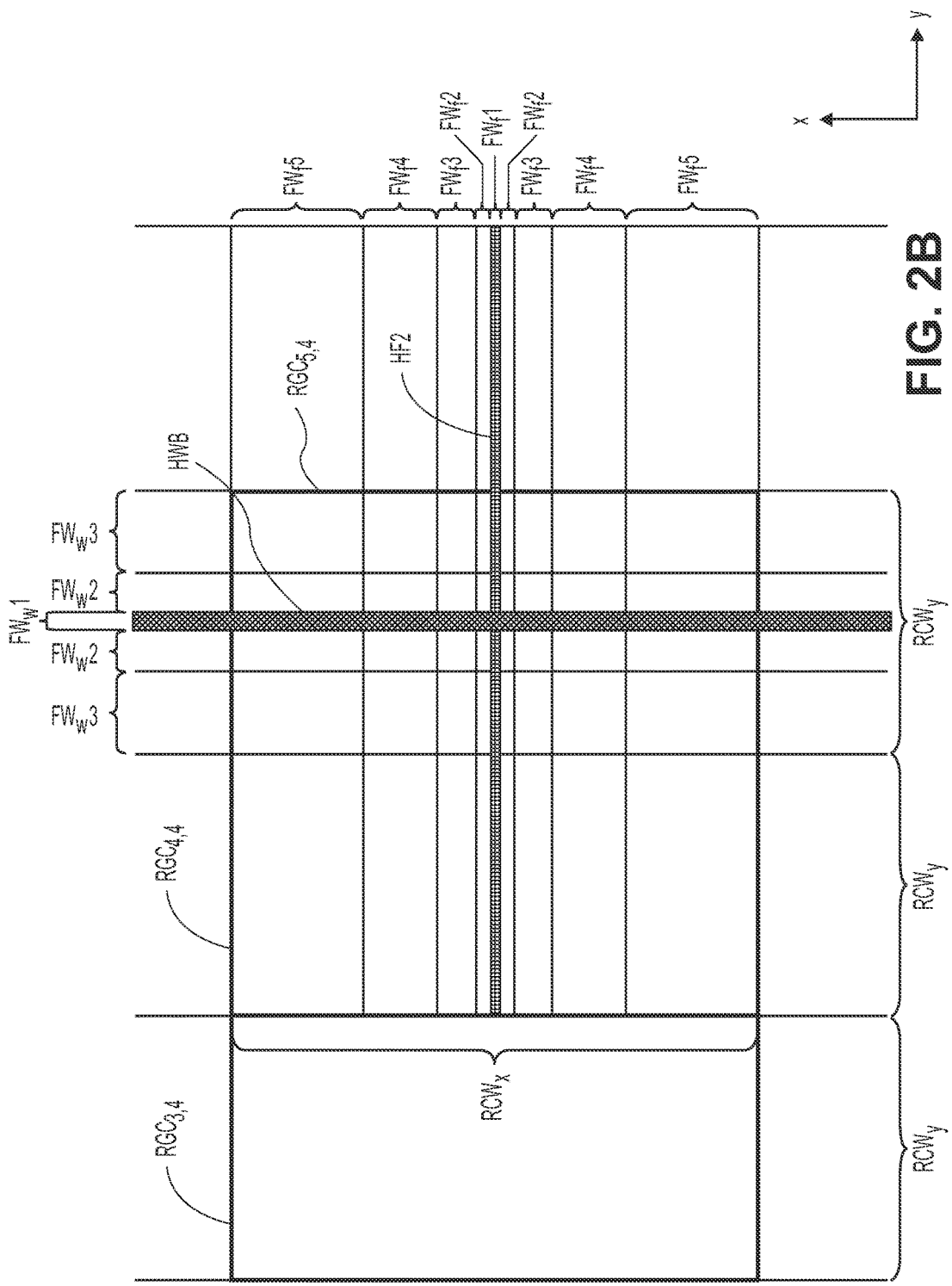

This invention will be described in connection with its embodiments, namely as implemented into a computerized system and method of operating the same for modeling and simulating the fluid and pressure behavior of tight gas formations in a production field, as it is contemplated that this invention will be especially beneficial in such an application. It is also contemplated, however, that embodiments of this invention can be beneficially implemented in other situations and applications. Accordingly, it is to be understood that the following description is provided by way of example only, and is not intended to limit the true scope of this invention as claimed.

FIG. 1 illustrates, in a simplified manner, volume V of the sub-surface of the earth, into which two gas wells H1, V1 are deployed. While not shown in FIG. 1, multiple sub-surface strata, or formations, are present within the volume, of varying composition, thickness, and location, depending on the geology and geologic history of that region of the earth. For purposes of describing embodiments of this invention, one or more of those formations within volume V are "tight gas" formations, which are known as formations of porous rock that contain natural gas, but that are relatively impermeable to the flow of that gas through the rock. Examples of tight gas formations include gas shales, and gas coals. The gas retained within those tight gas formations is not easily producible, for example by simply drilling a well into the formation as in conventional gas reservoirs such as those formed by salt domes.

In the example of FIG. 1, vertical gas well V1 is a conventional well located at the surface of volume V, with wellbore VWB extending largely in a vertical direction into volume V, to a desired depth. As mentioned above, volume V in this example includes tight gas formations. As such, hydraulic fracturing has been performed at vertical gas well V1, forming hydraulic fracture HF1 extending perpendicularly away from wellbore VWB as shown in FIG. 1. Vertical wells such as well V1 of FIG. 1 typically have only a single hydraulic fracture extending into the gas-bearing formation, because the formation is typically relatively thin in the vertical direction; if the formation is relatively thick in the vertical direction, however, multiple hydraulic fractures may be present.

Tight gas formations have recently been exploited by way of horizontal drilling, which allows the extension of the wellbore for a longer distance within a tight gas-bearing rock, thus improving the ability of the well to produce economically useful quantities of gas. Horizontal well H1 shown in FIG. 1 is an example of such a horizontally drilled well. As shown in FIG. 1, wellbore HWB includes a vertical portion extending vertically from the surface of volume V, and a lateral portion extending horizontally from the vertical portion at the desired depth. Tight gas formations are typically anisotropic in strain characteristics, such that a preferential direction for horizontal drilling through a tight gas formation is usually present; the lateral portion of wellbore HWB will generally extend in the low strain direction. And as shown in FIG. 1, hydraulic fracturing has been performed at well H1, creating multiple fractures HF2 through HF4 extending perpendicularly away from the lateral portion of wellbore HWB. These multiple fractures HF2 through HF4 are available because the typical tight gas formation tends to extend much longer in the lateral directions (i.e., parallel to the surface of the earth) than in the vertical direction (i.e., its thickness).

Typical production fields include many wells such as wells H1, V1, in some cases numbering as many as a few thousand; the horizontal wells in such a field will each typically have multiple fractures extending therefrom, in the manner illustrated in FIG. 1. Even though the permeability of the tight gas formations is relatively low (e.g., as low as the nanodarcy range), these multiple wells into the same tight gas formation will interact with one another, depending of course on their proximity to one another and the properties of the rock among the various wells. In addition, as typical in the art, reservoir pressure will degrade with cumulative production from the reservoir over time, corresponding to a more indirect and long term interaction among the various wells. Because of the interaction among wells and the production-vs.-pressure relationship in the reservoir, it is useful to simulate fluid flow and pressure characteristics of the production field (i.e., volume V of FIG. 1) over time, based on a model of the various rock properties and behavior of the formations within volume V. Such simulation can characterize the expected behavior of the production field in the future, and can be used to evaluate the economic benefit of the placement of a new well in the field at various locations, or the effect of shutting-in an existing well on the production from the other wells. Spacing of production wells in a gas production field is an important economic determination, given the incremental cost of drilling an additional well, and the requirements to carry out hydraulic fracturing and other efforts to obtain economically important output from that additional well. Such simulation may also, in some situations, be useful in determining when to re-work an individual well.

For purposes of such a simulation, according to embodiments of this invention, volume V is modeled by way of assigning rock properties and the like to incremental volume cells within the overall model. Relevant rock and fluid properties are assigned to each cell, allowing finite-difference techniques and the like to be used in simulating fluid flow, pressure distribution, and other effects over time in the volume, beginning from an initial state. FIG. 2a illustrates a generalized example of the sub-division of a portion of volume V including the lateral portion of wellbore HWB, into incremental cells within a grid for purposes of such modeling. In this example, one partial plane (in the vertical direction) is shown by way of j rows of k columns of root grid cells $RGC_{0,0}$ through $RGC_{j,k}$, which are of the coarsest (i.e., largest) size in each dimension. Of course, as shown in FIG. 1, additional planes of root grid cells will lie above and below those cells RGC (i.e., into and out of the page of FIG. 2a).

In this example, wellbore HWB extends from root grid cell $RGC_{5,0}$ into $RGC_{5,9}$, with three hydraulic fractures HF2 through HF4 located along its length. For example, hydraulic fracture HF2 is centered at root grid cell $RGC_{5,4}$; fractures HF3, HF4 are located at root grid cells $RGC_{5,6}$, $RGC_{5,8}$, respectively. These hydraulic fractures HF1 through HF4 tend to be planar, oriented transversely to their respective wellbores.

As mentioned above, volume V may be relatively large. As such, root grid cells RGC themselves may be relatively large in size. For example, root grid cells RGC may have a width $RCW_x$ in the x-direction (horizontal in FIG. 2a) of on the order of several hundred feet, and a width $RCW_y$ in the y-direction (vertical in FIG. 2a) also on the order of several hundred feet. Similarly, the depth (into and out of the page) of each root grid cell RGC may be on the order of several hundred feet. The widths of root grid cells RGC in the x- and y-directions may differ from one another. These relatively large root grid cell widths keep the number of root grid cells to a reasonable number, from the standpoint of computational complexity, such that the finite-difference or other simulation of fluid, pressure, etc. within volume V can converge within a reasonable time.

However, when modeling tight gas formations in this manner, root grid cells that are on the order of hundreds of feet on a side will not provide adequate accuracy. In those tight gas formations, pressures can change over very short distances, because of the extremely low (nanodarcy) gas permeability in those rocks. Modeling of the behavior of tight gas formations, using grid cells that are hundreds of feet on a side and thus orders of magnitude larger than the scale of the behavior sought to be modeled, will simply not represent the true nature of fluid flow and pressure differentials. On the other hand, if grid cells of sizes corresponding to the scale at which pressure changes in tight gas formations are used, the computational complexity and cost of executing the simulation become prohibitive.

According to embodiments of the invention, the technique of local grid refinement (LGR) is applied to the computerized modeling of gas formations in a particularly efficient and compact manner. More specifically, embodiments of this invention enable enhanced and improved resolution in the simulation of gas reservoir behavior over long periods of time, while maintaining reasonable computational cost and complexity. The theory underpinning this invention will now be described, first in connection with the special case of fractures that extend substantially (if not exactly) perpendicularly to the wellbore (and aligned with the axes of the grid modeling the reservoir), referred to herein as the orthogonal fracture case, and then for the general case in which the fractures run at non-orthogonal angles, and may be branching or otherwise complex (e.g., dendritic).

Orthogonal Fracture Case

FIG. 2b illustrates the generalized arrangement of LGR fine grid placement according to embodiments of the invention, for the example of horizontal fracture HF2 extending perpendicularly from the lateral portion of horizontal wellbore HWB of well H1 of FIG. 2a, within root grid cell $RGC_{5,4}$. The reader should note that the view of FIG. 2b is rotated 90° from the view of FIG. 2a.

According to embodiments of this invention, the root grid cells through which wellbore HWB and horizontal fracture HF2 pass are sub-divided into finer grid cells, in an automated manner. Root grid cell $RGC_{5,4}$ itself has dimensions of width $RCW_x$ by $RCW_y$. The width $RCW_y$ of root grid cell $RGC_{5,4}$ in the y-direction, parallel to wellbore HWB, is divided into five sub-widths in this example. The section of the narrowest sub-width $FW_w1$ represents a small distance into the surrounding formation on either side of wellbore HWB, and includes wellbore HWB itself. Two sections of sub-width $FW_w2$ are adjacent to opposing sides of the center grid section of sub-width $FW_w1$, and two grid sections of sub-width $FW_w3$ are adjacent to each grid section of sub-width $FW_w2$. The more distant grid sections from wellbore HWB are of greater width (i.e., $FW_w3 > FW_w2 > F_w1$). Similarly, the width $RCW_x$ of root grid cell $RGC_{5,4}$ in the x-direction, parallel to hydraulic fracture HF2, is divided into nine grid sections in this example. Grid section of the narrowest sub-width $FW_f1$ includes hydraulic fracture HF2 itself, and some small distance into the surrounding formation on either side thereof. Grid sections of ever increasing width (i.e., $FW_f5 > FW_f4 > FW_f3 > FW_f2 > F_w1$) in the x-direction are then adjacent to opposing sides of the center grid section. The intersections of the lines defining the grid section sub-widths define the bounds of finer resolution grid cells to be used in modeling the behavior of the reservoir. In this example, with the width $RCW_y$ divided into five "splits", and the width $RCW_x$ divided into nine "splits", root grid cell $RGC_{5,4}$ at the location from which hydraulic fracture HF2 emanates from wellbore HWB will include forty-five grid cells (in the two-dimensional plane shown in FIG. 2b), ranging in area (in the cross-section of FIG. 2b) from a single grid cell of smallest area $FW_w1 \cdot FW_f1$, to four grid cells of largest area $FW_w3 \cdot FW_f5$. While FIG. 2b suggests that the smallest grid cell (i.e., at the point of wellbore HWB from which hydraulic fracture HF2 emanates) is centered within root grid cell $RGC_{5,4}$, it should be appreciated that this central grid need not be so centered in all cases.

In general, the modeled volume will be three-dimensional, such that each grid cell represents a volume (typically in the shape of a right parallelepiped). To simplify the simulation, and considering that such changes in properties in the vertical direction exhibited in gas formations are captured by geological modeling, it is contemplated that the refinement of the grid in the vertical direction will not typically be required. Rather, the grid cells above and below the plane of wellbore HWB and fractures HF2 (i.e., into and out of the page in the view of FIG. 2b) may retain their root grid cell size. The vertical depth of each plane of grid cells is typically smaller than the grid cell widths ($RCW_x$, $RCW_y$) in the x and y directions; for example, for root grid cell widths $RCW_x$, $RCW_y$ of on the order of hundreds of feet, the root grid cell depth in the vertical dimension may be on the order of tens of feet. Of course, similar LGR subdivision of root grid cell $RGC_{5,4}$ may also be performed in the vertical dimension (into and out of the page of the view of FIG. 2b), in similar fashion, if desired and useful, as an option in the automated method of embodiments of this invention.

The subdivision of root grid cells in a given direction follows with wellbore HWB and hydraulic fracture HF2, as the case may be. For example, the width $RCW_x$ of root grid cell $RGC_{4,4}$ to the left of root grid cell $RGC_{5,4}$ (in the view of FIG. 2b) is divided in the x-direction into nine finer grid cells, as hydraulic fracture HF2 runs through it. Each of those nine finer grid cells is not subdivided in the y-direction because wellbore HWB does not pass through root grid cell $RGC_{4,4}$, and thus root grid cell $RGC_{4,4}$ retains its width $RCW_y$. Similarly, the width $RCW_y$ of the root grid cells above and below root grid cells $RGC_{5,4}$ (in the view of FIG. 2b) will be divided in the y-direction into five finer grid cells, while these root grid cells will retain their x-direction width $RCW_x$, because wellbore HWB passes through those root grid cells but hydraulic fracture HF2 does not. Root grid cells containing no portion of either wellbore HWB or hydraulic fracture HF2, such as root grid cell $RGC_{3,4}$ of FIG. 2b, are not subdivided, but remain at their full $RCW_x \cdot RCW_y$ cross-sectional area.

Once the root grid cells containing either or both of wellbore HWB and hydraulic fracture HF2 are subdivided according to embodiments of the invention, such as shown in FIG. 2b, modeling properties of the relevant formation (such properties including porosity, permeability, etc.) are assigned to each grid cell. The resulting model is then ready for simulation.

As a result of this embodiment of the invention, conventional reservoir simulation applications can be used to precisely and accurately simulate the behavior of the well and reservoir, without requiring fine resolution grid cells throughout the modeled volume. Fluid and pressure behavior near the wellbore and fractures can be modeled at a fine resolution corresponding to the scale at which pressure changes are present at those locations. In addition, as will be described below, the generation of the finer resolution grid cells can be performed by a conventional computer system in an automated manner, working from the coarse grid locations of wells and wellbores in the reservoir.

Generalized (Complex) Fracture Case

While the orthogonal approach described above has been observed to work well for situations in which fractures extend substantially perpendicularly from wellbore perforations, many wells and reservoirs exhibit complex (e.g., branching) and non-orthogonal fracture patterns. In some cases, gas shales and sands exhibit anisotropic internal strain properties, resulting in fractures that extend at varying angles from the wellbore. In addition, branching or dendritic fracture patterns often result from hydraulic fracturing in some formation types such as shales and coal beds.

Figure 3A:
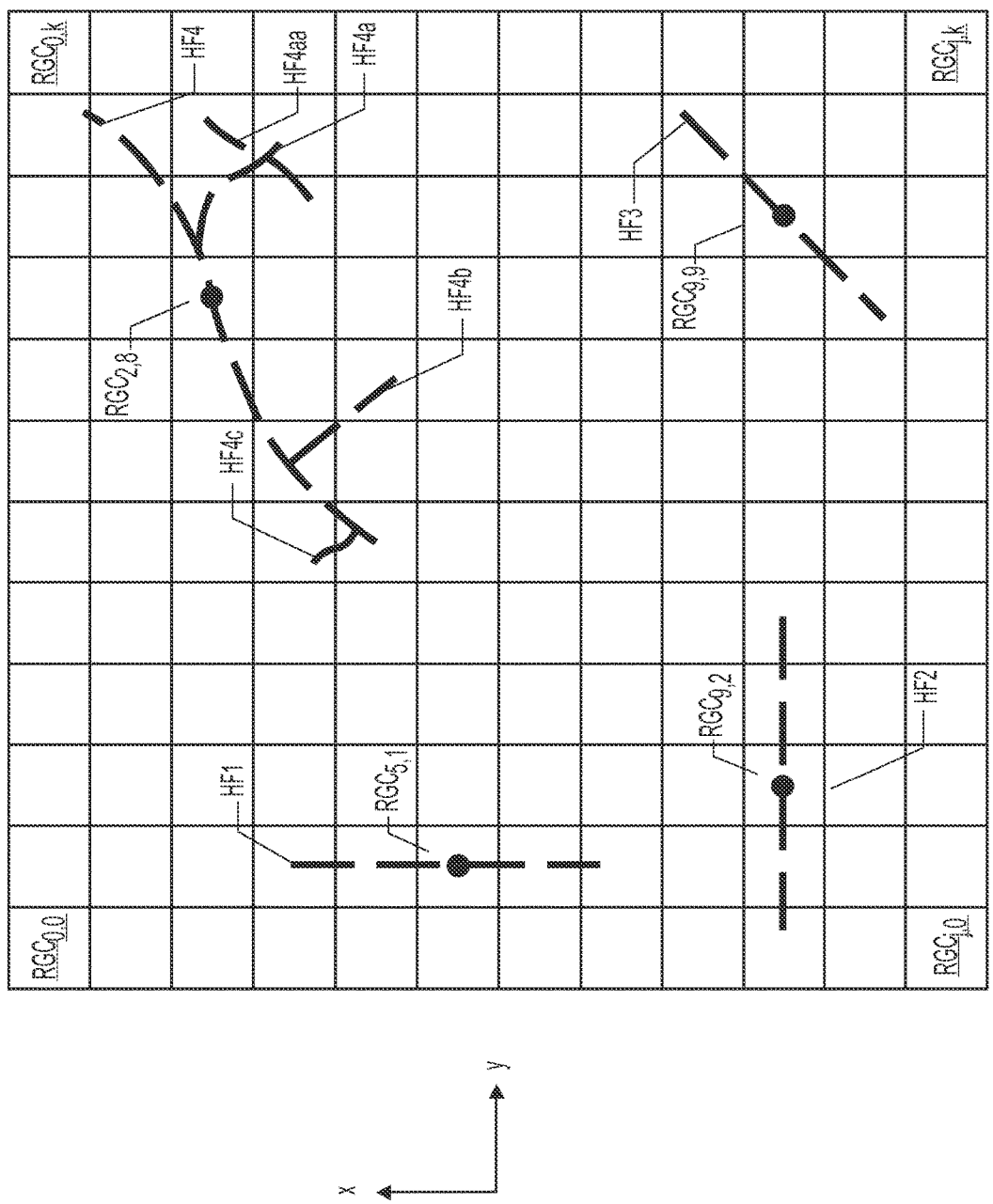

FIG. 3a illustrates examples of various hydraulic fractures, including some that are not readily comprehended by the orthogonal approach described above in connection with FIGS. 2a and 2b. The corresponding wellbores are not shown in FIG. 3a, for clarity; the fractures shown in FIG. 2c may emanate from either horizontal or vertical wellbores, as discussed above. Hydraulic fractures HF1, HF2 of FIG. 3a emanate in directions that are parallel to the axes of the grid of root grid cells $RGC_{j,k}$. Fracture HF1 extends in the x-direction from a wellbore perforation in root grid cell $RGC_{5,1}$, and fracture HF2 extends in the y-direction from a wellbore perforation in root grid cell $RGC_{9,2}$ as shown. As such, the vicinity of fractures HF1, HF2 can be subdivided according to the local grid refinement approach described above in a manner suitable for the simulation.

Hydraulic fracture HF3 of FIG. 3a extends from a wellbore perforation in root grid cell $RGC_{9,9}$ but at an angle relative to the axes of the grid of root grid cells $RGC_{j,k}$. Given the orientation of fractures HF1, HF2, the grid cannot be oriented so that all three fractures HF1, HF2, HF3 run parallel to its axes. As such, the local grid refinement approach described above relative to FIGS. 2a and 2b is not readily applicable to fracture HF3.

Hydraulic fracture HF4 of FIG. 3a extends from a wellbore perforation in root grid cell $RGC_{2,8}$, but does not run in a straight line, nor orthogonally relative to the axes of the grid. In this example, the main branches of fracture HF4 are slightly curved. In addition, fracture HF4 appears as a dendritic complex fracture, with sub-fractures HF4a, HF4b, HF4c extending from the main branches of fracture HF4. Sub-sub-fracture HF4aa extends from sub-fracture HF4a. Depending on the sub-surface geology, dendritic fracture networks can be substantially more complex than that of fracture HF4 in this example. As apparent from FIG. 3a, the orthogonal local grid refinement approach of FIGS. 2a and 2b are not readily applicable to complex fractures such as that associated with fracture HF4.

According to embodiments of this invention, however, a "nested LGR" approach is applied to non-orthogonal fractures such as fracture HF3, and to non-linear, complex, and dendritic fracture networks such as that associated with fracture HF4, as will now be described in connection with FIGS. 3b through 3e.

Figure 3B:
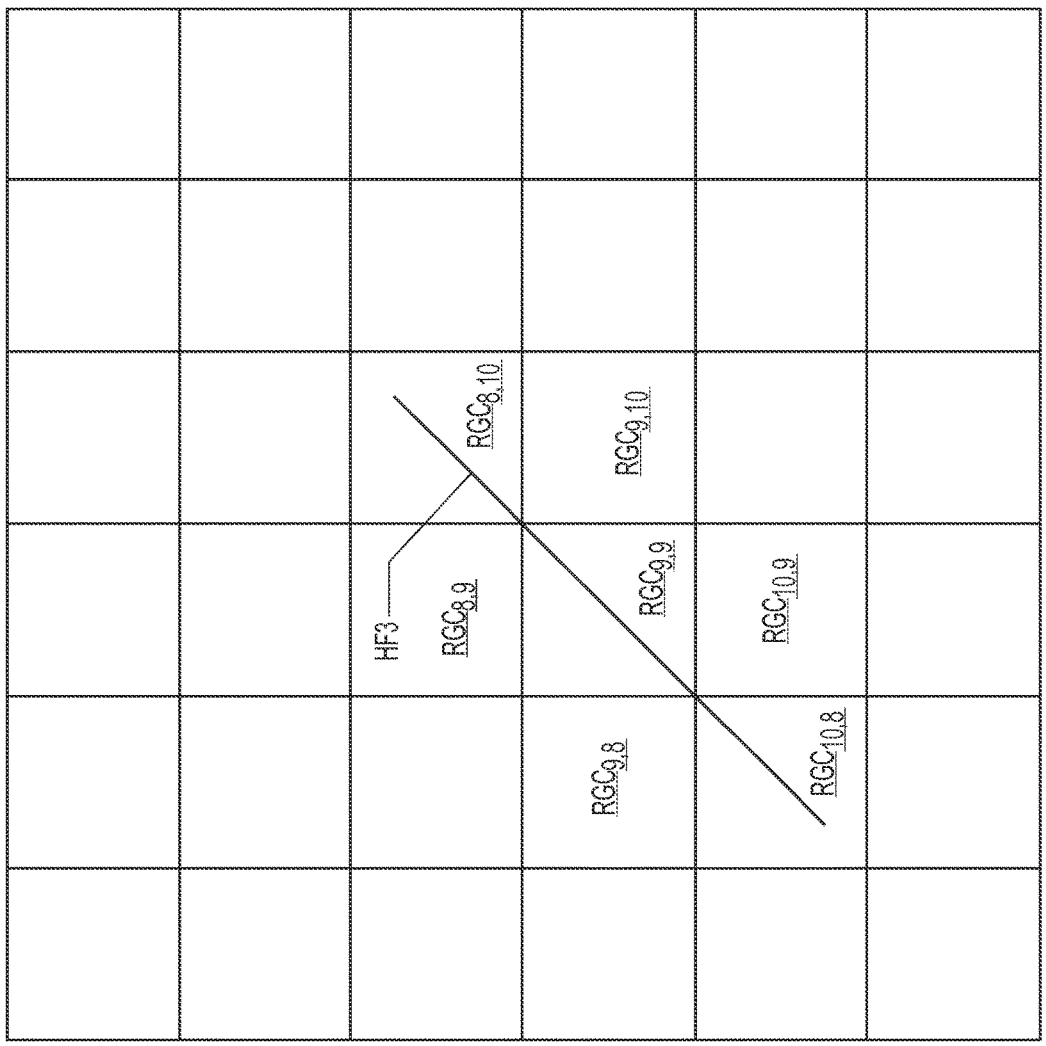

FIG. 3b illustrates a portion of the grid of FIG. 3a, for the area near hydraulic fracture HF3. As shown in FIG. 3b, hydraulic fracture HF3 runs through root grid cell blocks $RGC_{10,8}$, $RGC_{9,9}$, $RGC_{8,10}$, at a 45° angle relative to the axes of this grid. At this angle, hydraulic fracture HF3 also passes through grid vertices shared also by root grid cells $RGC_{9,8}$, $RGC_{10,9}$, $RGC_{9,10}$, $RGC_{8,9}$. According to the nested LGR approach of embodiments of these inventions, each of these grid cell blocks that contain any portion of hydraulic fracture HF3, including those grid cell blocks sharing a vertex through which hydraulic fracture HF3 passes, are sub-divided. FIG. 3c illustrates an example of this first level sub-division of these root grid cells, in which each root grid cell $RGC_{j,k}$ touched by hydraulic fracture HF3 is sub-divided into equal size quadrants a, b, c, d. As shown in FIG. 3c, hydraulic fracture HF3 runs between quadrant c of root grid cell $RGC_{10,8}$ to quadrant b of root grid cell $RGC_{8,10}$, and four other root grid cell quadrants between those end quadrants. Again, because of the 45° angle of hydraulic fracture HF3 to the axes of the grid, hydraulic fracture HF3 passes through vertices among some of those quadrants.

Figure 3D:
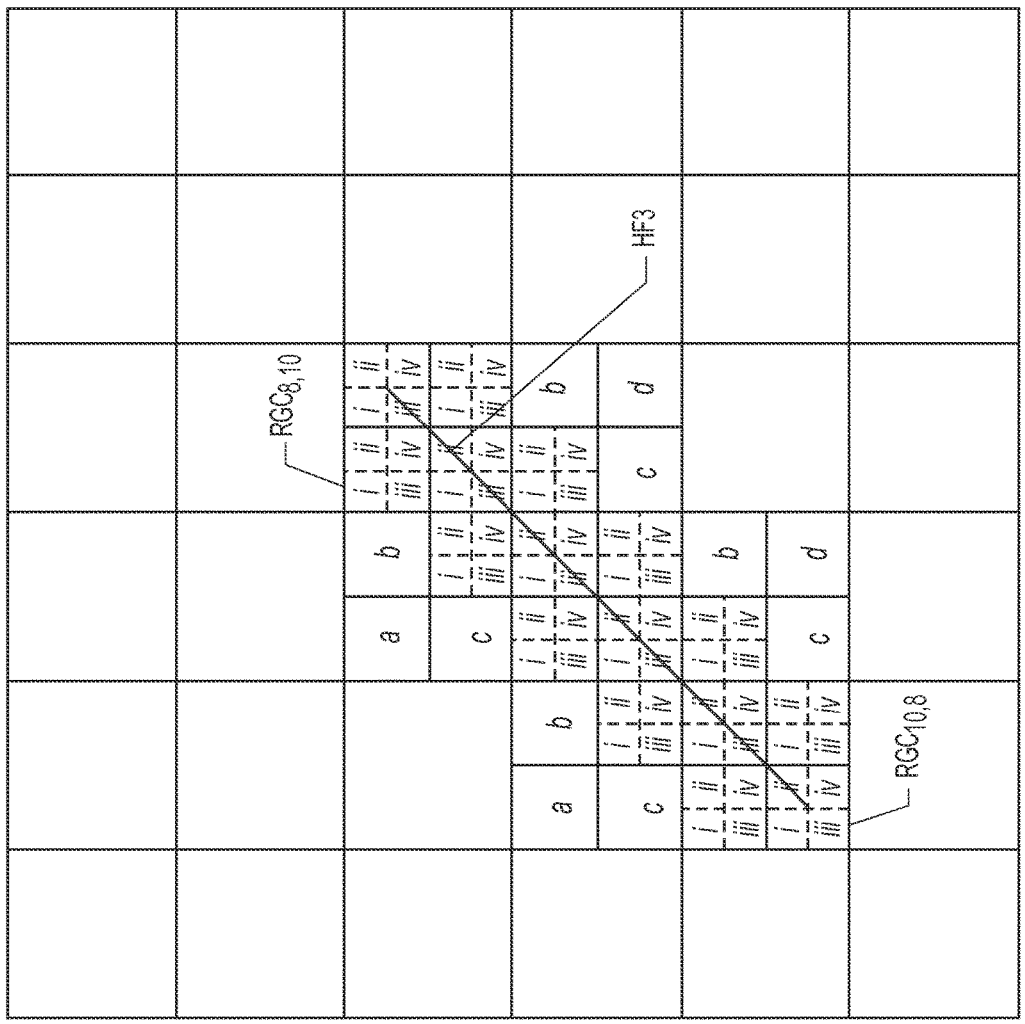

The size of quadrants a, b, c, d within root grid cells $RGC_{j,k}$ may still be large relative to the spatial scale of pressure and fluid flow behavior. As such, additional sub-division of the grid cells is appropriate. According to embodiments of this invention, only the root grid cell quadrants a, b, c, d through which hydraulic fracture HF3 passes, or that have a vertex through which hydraulic fracture HF3 passes, are sub-divided to the next level. FIG. 3d illustrates an example of the further sub-division of the quadrants shown in FIG. 3c, according to embodiments of this invention. In this example, quadrants such as each quadrant of root grid cells $RGC_{10,8}$, $RGC_{9,9}$, $RGC_{8,10}$ are further sub-divided into sub-sub-quadrants i, ii, iii, iv, because hydraulic fracture HF3 passes through its quadrants b, c, and also through the central vertex of those root grid cells. For root grid cell $RGC_{9,8}$, only its quadrant d is sub-divided into sub-sub-quadrants i, ii, iii, iv in this example, since only that quadrant d is touched by hydraulic fracture HF3; the other quadrants a, b, c of root grid cell $RGC_{9,8}$ are not further sub-divided at this level of nesting. The other root grid cells $RGC_{j,k}$ in the vicinity of hydraulic fracture HF3 are similarly treated at this level of sub-division.

If a horizontal wellbore is associated with hydraulic fracture HF3, similar nested sub-division of the root grid cells $RGC_{j,k}$ affected by that wellbore may simultaneously be performed. Of course, if that wellbore is parallel to one of the axes of the grid, the orthogonal LGR approach described above may be applied to root grid cells $RGC_{j,k}$ surrounding the wellbore.

This nested sub-division continues for as many levels as desired by the analyst, depending on the spatial scale to which the local grid refinement is desired, considering both the scale of pressure and fluid flow behavior for the particular formation, and also the computational resources available for the desired modeling and simulation. As in the orthogonal situation, following the nested sub-division of the root grid cells containing hydraulic fracture HF3 according to embodiments of the invention, modeling properties of the relevant formation (such properties including porosity, permeability, etc.) are assigned to each grid cell. The resulting model is then ready for simulation.

As described above, finite-difference modeling simulates the behavior of fluid flow in the subsurface by assigning rock properties pertaining to fluid conductivity, such as porosity and permeability, to each root grid cell and sub-division, with even the smallest nested sub-division being assigned its own properties. The formation model is constructed from one or more functions for expressing flow out of the cell as a function of flow into the cell, and for expressing the fluid pressure within the cell. However, some formations have anisotropic rock properties, such that permeability is significantly greater in one direction than in another direction. Tight gas formations exhibit such anisotropy, especially following hydraulic fracturing. For example, permeability within a fracture may be several orders of magnitude greater than permeability perpendicular to the fracture. In the orthogonal situation described above, this anisotropy can be easily handled. However, in the generalized case such as that described relative to FIGS. 3a through 3d, the fractures do not run parallel to the grid axes, and thus the direction of the fracture is a significant factor in grid cell behavior.

The nested LGR approach described in this example with reference to a straight-line non-orthogonal fracture HF3 may be applied to a hydraulic fracture with non-linear portions, and to such fractures with complex (e.g., dendritic) structure.

According to embodiments of this invention, a tensorial adjustment to fracture permeability is applied to the resulting model, to account for the effects of this anisotropy. Kasap et al., "Calculating the Effective Permeability Tensor of a Gridblock", *SPE Formation Evaluation* (SPE, June 1990), pp. 192-200; and Charfeddine et al., "Reconciling Core Derived Permeabilities and Well Test Using a Fracture Network: A Field Case Example", SPE Paper No. 78499, *10th Abu Dhabi International Petroleum Exhibition and Conference* (SPE, 2002), both incorporated herein by this reference, describe examples of such a tensorial adjustment to permeability suitable for application to embodiments of this invention.

FIG. 3e illustrates an approach to applying the heterogeneous permeabilities to the modeling and simulation of fluid flow for hydraulic formation HF3 that is oblique to the grid axes, according to embodiments of this invention. As suggested by FIG. 3e, hydraulic fracture HF3 is considered as having a "zig-zag" fluid flow path through the formation for purposes of this model. In this case, the wellbore is at the center of root grid cell $RGC_{9,9}$, such that flow through the fracture is toward that central point. Flow path FV is a piece-wise linear path along the sub-sub-quadrants in the nested LGR representation of FIG. 3d that are intersected by hydraulic fracture HF3 (including those having a border along which hydraulic fracture HF3 passes), with each segment of flow path FV being parallel to one of the grid axes x, y. The anisotropic permeability of the fractured grid is incorporated by deriving permeability $k_x$ in the x-direction and permeability $k_y$ in the y-direction, with $k_x \neq k_y$ for the general case.

As described in the above-incorporated Charfeddine et al. paper, the permeabilities $k_x$, $k_y$ can be derived from the assumption that a maximum permeability $k_{max}$ for a grid cell is in the direction of the fracture in that grid cell (i.e., the fracture permeability), and that a minimum permeability $k_{min}$ is in the direction perpendicular to the fracture (i.e., the original root grid cell permeability). For fracture HF3 within a grid cell sub-division at an angle α relative to the horizontal (x-axis), the permeabilities $k_x$, $k_y$ can be expressed as:

$$k_x = k_{max} \cos^2\alpha + k_{min} \sin^2\alpha$$

and $$k_y = k_{max} \sin^2\alpha + k_{min} \cos^2\alpha$$

Once deriving the permeabilities $k_x$, $k_y$, the model of the formation can be readily derived by modeling the fluid flow in this piece-wise, zig-zag, fashion with different permeabilities for the segments depending on the orientation of the fracture. It is contemplated that the grid cell sub-divisions resulting from the nested LGR described above can be made sufficiently small so that the fracture can run essentially linearly through that sub-division; if not, it is contemplated that a straight-line approximation of the fracture can be assigned. Further, it is contemplated that the angle α of the grid cell sub-division relative to the horizontal (x-axis) can vary from sub-division to sub-division for those fractures that are not straight-line paths over their length, which may be accounted for in the derivation of the permeabilities $k_x$, $k_y$ for those sub-divisions.

As evident from FIG. 3e, the piece-wise linear zig-zag fracture flow path FV has an overall length greater than that of hydraulic fracture HF3 that it represents. This difference in path length is adjusted to the length of fracture HF3 itself, for purposes of the model of the sub-surface formation in the vicinity of hydraulic fracture HF3, according to embodiments of this invention.

Upon completion of the sub-division processes, the then-defined sub-divisions of root grid cells $RGC_{j,k}$ according to this nested local grid refinement will each be assigned permeability values, considering the anisotropic permeability due to the presence of hydraulic fracture HF3, and according to the orientation of the grid axes. As described above, each sub-division will have a pair of adjusted permeability values $k_x$, $k_y$ associated with flow in the x- and y-directions, respectively. These adjusted permeability values $k_x$, $k_y$ will account for the longer flow path length of the piece-wise zig-zag path relative to the direct path of fracture HF3. The resulting model is then suitable for simulation of reservoir behavior, according to the desired initial conditions and other parameters.

It is contemplated that those skilled in the art having reference to this specification can readily apply the nested LGR approach described above to the generation of a model for hydraulic fractures of any arbitrary and complex arrangement, without undue experimentation.

By virtue of embodiments of this invention, both in the orthogonal and in the generalized case, those skilled in the art having reference to this specification will recognize that the number of finer grid cells provided by embodiments of this invention can remain reasonable, and suitable for accurate simulation using conventional reservoir simulation applications, by providing fine resolution modeling at locations near the wellbore and fractures. In addition, as will also be apparent to those skilled in the art from this specification, the generation of the finer grid cells can be performed by a conventional computer system in an automated manner, working from the coarse grid locations of wells and wellbores in the reservoir, and inputs regarding the numbers of splits to be applied in each direction. Such automation also assists in providing an efficient system and method of modeling and simulation, greatly reducing the human efforts required to carry out conventional LGR techniques.

Computerized System

Figure 4:
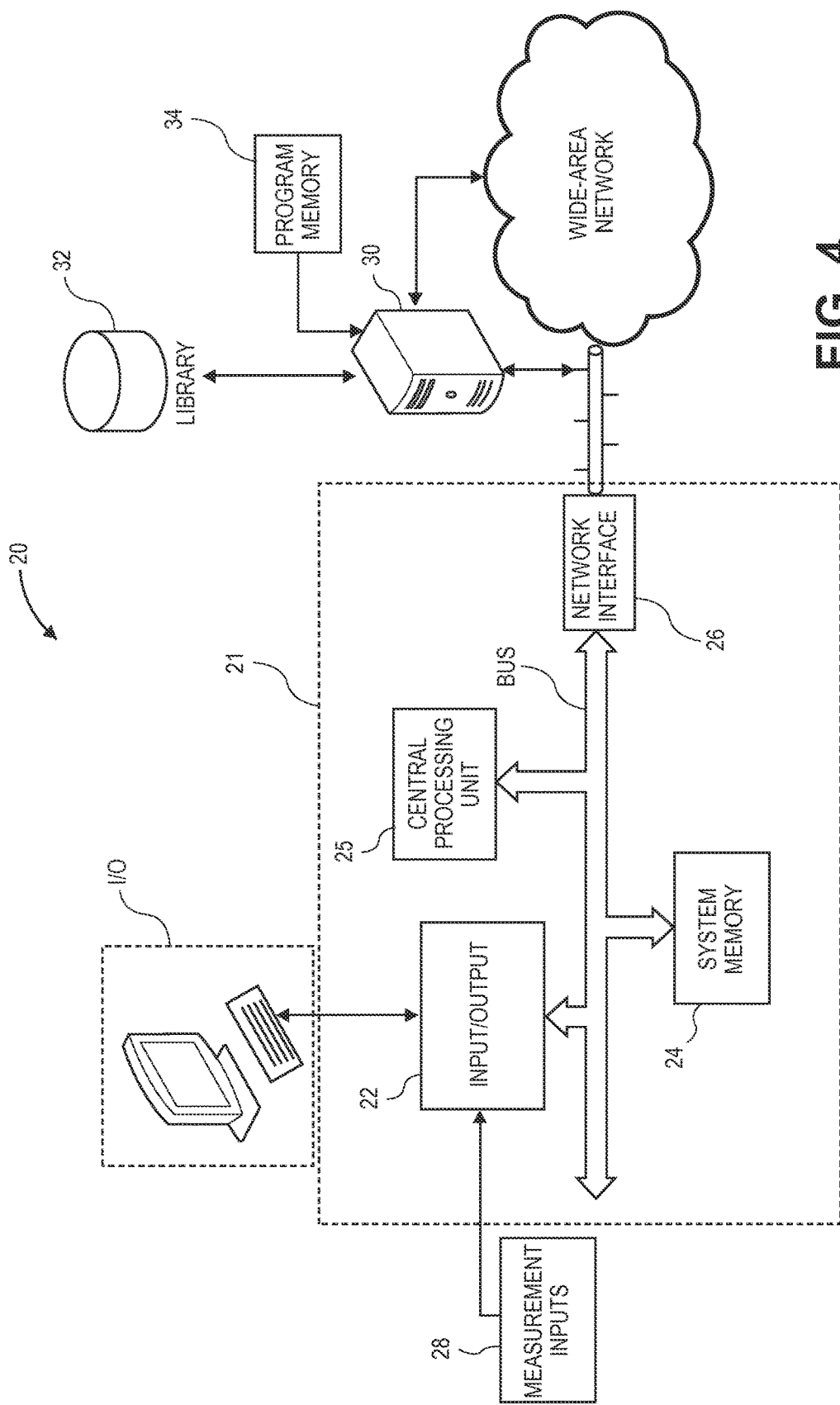
FIG. 4 is an electrical diagram, in schematic form, of a networked computer system programmed to execute various processes in the modeling and simulation of a gas reservoir, according to embodiments of the invention.

Embodiments of this invention are directed to a computerized method and system for creating a model of a sub-surface region of the earth, such as may include one or more tight gas formations into which wells have been drilled, and completed with hydraulic fracturing, and for carrying out a simulation of the fluid and pressure behavior of the modeled region. FIG. 4 illustrates, according to an exemplary embodiment, the construction of modeling and simulation system ("system") 20, which performs the operations described in this specification to efficiently derive a gridded finite-difference type of model of a production field, and carrying out the desired simulation. In this example, system 20 can be realized by way of a computer system including workstation 21 connected to server 30 by way of a network. Of course, the particular architecture and construction of a computer system useful in connection with this invention can vary widely. For example, system 20 may be realized by a single physical computer, such as a conventional workstation or personal computer, or alternatively by a computer system implemented in a distributed manner over multiple physical computers. Accordingly, the generalized architecture illustrated in FIG. 4 is provided merely by way of example.

As shown in FIG. 4 and as mentioned above, system 20 includes workstation 21 and server 30. Workstation 21 includes central processing unit 25, coupled to system bus BUS. Also coupled to system bus BUS is input/output interface 22, which refers to those interface resources by way of which peripheral functions I/O (e.g., keyboard, mouse, display, etc.) interface with the other constituents of workstation 21. Central processing unit 25 refers to the data processing capability of workstation 21, and as such may be implemented by one or more CPU cores, co-processing circuitry, and the like. The particular construction and capability of central processing unit 25 is selected according to the application needs of workstation 21, such needs including, at a minimum, the carrying out of the functions described in this specification, and also including such other functions as may be executed by system 20. In the architecture of system 20 according to this example, system memory 24 is coupled to system bus BUS, and provides memory resources of the desired type useful as data memory for storing input data and the results of processing executed by central processing unit 25, as well as program memory for storing the computer instructions to be executed by central processing unit 25 in carrying out those functions. Of course, this memory arrangement is only an example, it being understood that system memory 24 can implement such data memory and program memory in separate physical memory resources, or distributed in whole or in part outside of workstation 21. In addition, as shown in FIG. 4, workstation 21 can receive, via input/output function 22, measurement inputs 28 from downhole and surface flow meters, pressure and temperature transducers, valve settings, and the like deployed at wells in the production field. These measurement inputs can be stored in a memory resource accessible to workstation 21, either locally or via network interface 26.

Network interface 26 of workstation 21 is a conventional interface or adapter by way of which workstation 21 accesses network resources on a network. As shown in FIG. 4, the network resources to which workstation 21 has access via network interface 26 includes server 30, which resides on a local area network, or a wide-area network such as an intranet, a virtual private network, or over the Internet, and which is accessible to workstation 21 by way of one of those network arrangements and by corresponding wired or wireless (or both) communication facilities. In this embodiment, server 30 is a computer system, of a conventional architecture similar, in a general sense, to that of workstation 21, and as such includes one or more central processing units, system buses, and memory resources, network interface functions, and the like. According to this embodiment of the invention, server 30 is coupled to program memory 34, which is a computer-readable medium that stores executable computer program instructions, according to which the operations described in this specification are carried out by analysis system 20. In this embodiment of the invention, these computer program instructions, for example in the form of an interactive application, are executed by server 30 upon input data communicated from workstation 21, to create output data and results that are communicated to workstation 21 for display or output by peripherals I/O in a form useful to the human user of workstation 21. In addition, library 32 is also available to server 30 (and perhaps workstation 21 over the local area or wide area network), and stores such archival or reference information as may be useful in system 20. Library 32 may reside on another local area network, or alternatively be accessible via the Internet or some other wide area network. It is contemplated that library 32 may also be accessible to other associated computers in the overall network.

Of course, the particular memory resource or location at which the measurements, library 32, and program memory 34 physically reside can be implemented in various locations accessible to system 20. For example, these data and program instructions may be stored in local memory resources within workstation 21, within server 30, or in network-accessible memory resources to these functions. In addition, each of these data and program memory resources can itself be distributed among multiple locations. It is contemplated that those skilled in the art will be readily able to implement the storage and retrieval of the applicable measurements, models, and other information useful in connection with this embodiment of the invention, in a suitable manner for each particular application.

According to this embodiment of the invention, by way of example, system memory 24 and program memory 34 store computer instructions executable by central processing unit 25 and server 30, respectively, to carry out the functions described in this specification, by way of which a computer model, of the finite-difference type, of the desired sub-surface portion of the earth can be created; in addition, system memory 24 and program memory 34 may also store computer instructions executable by central processing unit 25 and server 30, respectively, to carry out reservoir simulation using that model. These computer instructions may be in the form of one or more executable programs, or in the form of source code or higher-level code from which one or more executable programs are derived, assembled, interpreted or compiled. Any one of a number of computer languages or protocols may be used, depending on the manner in which the desired operations are to be carried out. For example, these computer instructions for creating the model according to embodiments of this invention may be written in a conventional high level language such as FORTRAN or C++, either as a conventional linear computer program or arranged for execution in an object-oriented manner. These instructions may also be embedded within a higher-level application. It is further contemplated that certain of the user inputs into the modeling process may be arranged into a spreadsheet created by a conventional application program such as the EXCEL® spreadsheet application available from Microsoft Corporation. Inputs regarding the sub-surface volume to be modeled may be generated in a conventional reservoir modeling program, such as the ROXAR RMS reservoir modeling software available from Emerson Process Management. Conventional reservoir modeling software may also be used to carry out the fluid and pressure behavior simulation using the model created according to embodiments of this invention, examples of such software including the VIP® reservoir simulation suite, and NEXUS® reservoir simulation software, both available from Halliburton. In any case, it is contemplated that those skilled in the art having reference to this description will be readily able to realize, without undue experimentation, this embodiment of the invention in a suitable manner for the desired installations. Further in the alternative, an executable web-based application can reside at program memory 34, accessible to server 30 and client computer systems such as workstation 21, receive inputs from the client system in the form of a spreadsheet, execute algorithms modules at a web server, and provide output to the client system in some convenient display or printed form. Alternatively, these computer-executable software instructions may be resident elsewhere on the local area network or wide area network, or downloadable from higher-level servers or locations, by way of encoded information on an electromagnetic carrier signal via some network interface or input/output device.

The computer-executable software instructions may have originally been stored on a removable or other non-volatile computer-readable storage medium (e.g., a DVD disk, flash memory, or the like), or downloadable as encoded information on an electromagnetic carrier signal, in the form of a software package from which the computer-executable software instructions were installed by system 20 in the conventional manner for software installation.

Operation of the Computerized System

Figure 5:
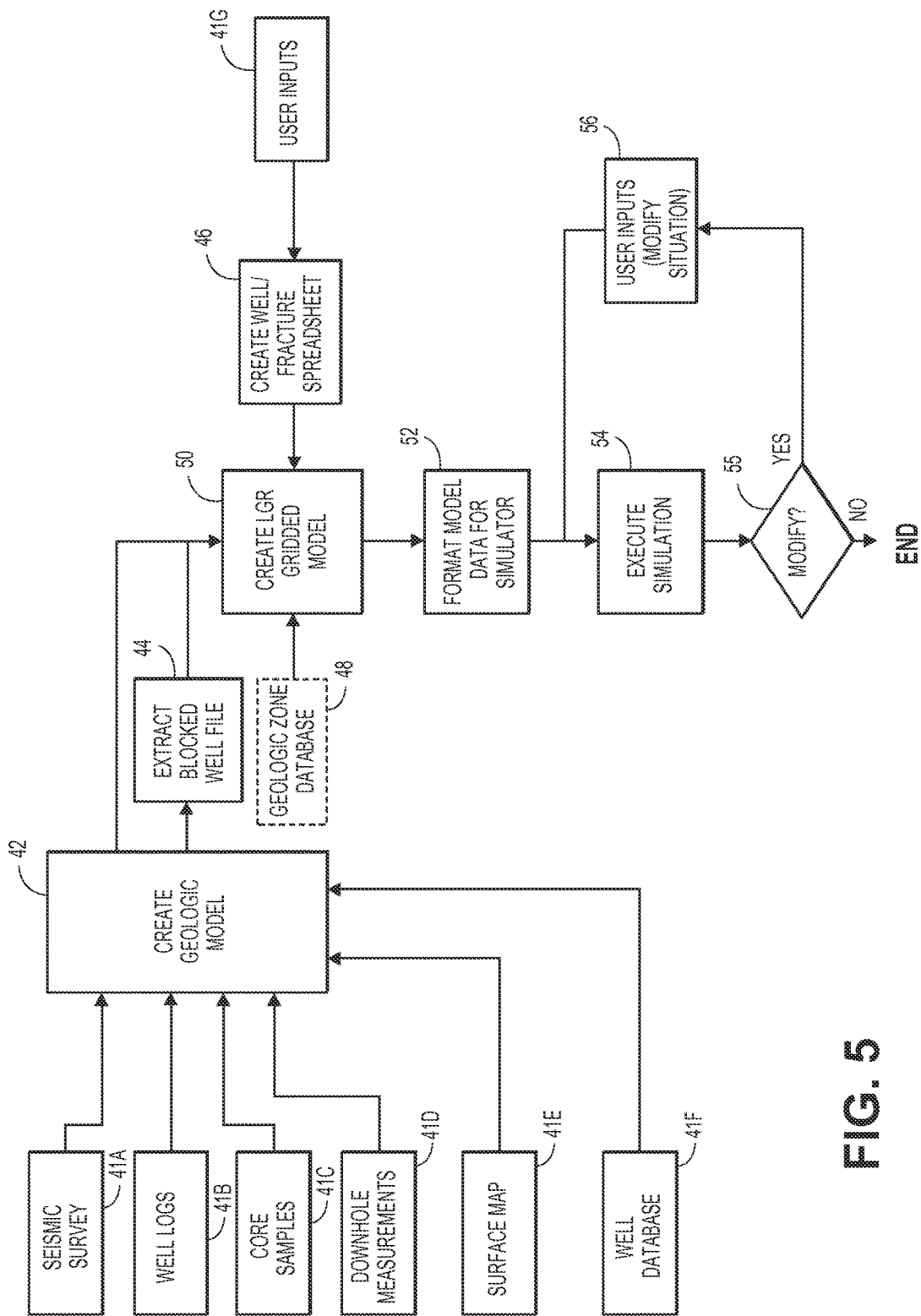
FIG. 5 is a flow diagram illustrating the operation of the system of FIG. 4 in the modeling and simulation of a gas reservoir, according to embodiments of the invention.

FIG. 5 illustrates the generalized operation of system 20 in generating a model of a tight gas reservoir in which one or more existing or potential wells, or both, are deployed with hydraulic fracturing, and the simulating of the behavior of that reservoir, according to embodiments of the invention. As discussed immediately above, it is contemplated that the various steps and functions in this process can be performed by one or more of the computing resources in system 20 executing computer program instructions resident in the available program memory, in conjunction with user inputs as appropriate. While the following description will present an example of this operation as carried out at workstation 21 in the networked arrangement of system 20 shown in FIG. 4, it is of course to be understood that the particular computing component used to perform particular operations can vary widely, depending on the system implementation. As such, the following description is not intended to be limiting, particularly in its identification of those components involved in a particular operation. It is therefore contemplated that those skilled in the art will readily understand, from this specification, the manner in which these operations can be performed by computing resources in these various implementations and realizations. Accordingly, it is contemplated that reference to the performing of certain operations by system 20 will be sufficient to enable those skilled readers to readily implement embodiments of this invention, without undue experimentation.

The modeling of tight gas reservoirs according to embodiments of this invention applies an automated local grid refinement (LGR) in a finite-difference type of model of the sub-surface formations including those bearing tight gas. In generating such an LGR model representation, various data inputs are useful. As shown in FIG. 5, according to an embodiment of the invention, a geologic model is created in process 42 from various available input data bases. In this embodiment of the invention, process 42 can be performed by system 20 executing conventional reservoir modeling software, such as the ROXAR RMS reservoir modeling software available from Emerson Process Management. The input data retrieved by system 20 and utilized in process 42 include seismic survey data 41*a*, well log data 41*b*, data 41*c* from core samples obtained from the drilling of existing exploratory and production wells in the production field being modeled, downhole sensor measurement data 41*d* obtained during production, surface map data 41*e*, and data 41*f* pertaining to the location of wells and wellbores of those wells. Other data useful in creation of the geologic model in process 42 may of course also be acquired and utilized; alternatively, not every source of data 41*a* through 41*f* need be used in creating this model. It is contemplated that these data 41*a* through 41*f* will typically be stored in computer-readable memory resources within or available to system 20, for example in data library 32 accessible over a local area network or a wide area network; of course, different data sources may be physically stored in different memory or library resources, as typical in the art. For the case of hydraulic fractures emanating orthogonally from their respective wellbores, those fractures are constrained to the same direction in process 42, and the resulting geologic model is oriented so that all hydraulic fractures extend in either of the x- or y-directions. For example, if the constrained orthogonal hydraulic fractures are oriented to extend parallel to a line running southwest to northeast in the actual field, the geologic model grid will be rotated 45° (from a north-south orientation), so that either the x-direction or the y-direction runs southwest to northeast. Root grid cell sizes are also defined in the creation of geologic model in process 42. System 20 then executes the appropriate computer software instructions in the modeling software, in process 42, to generate an output file in the appropriate format, including the relevant model parameters and locations of the particular features and wellbores within the modeled volume. For example, the geologic model output from process 42 may be an "RMS" file as generated by the ROXAR RMS reservoir modeling software.

In process 44, system 20 extracts information from the RMS output of process 42 to produce a "blocked well file". This blocked well file generated in process 44 extracts wellbore trajectories within the volume to be modeled from the geologic model generated in process 42. Those wellbores are "blocked" in the sense that these locations are specified with reference to grid blocks (i.e., root grid cells) within the three-dimensional representation of the volume to be modeled. The extracted blocked well file from process 44 is provided as an input to process 50, in which an LGR gridded model will be created according to embodiments of this invention, as will be described below in further detail. Other information regarding the geology and other attributes from the RMS output of process 42 is also provided to process 50.

According to embodiments of this invention, another source of input data to process 46 are provided by user inputs 41*g*, for example as a spreadsheet or other data file containing information regarding the hydraulic fractures to be modeled is provided as an input to LGR model creation process 50. The particular spreadsheet or other data file generated in process 46 will depend upon the format of the input data expected or desired by process 50. According to one implementation, these user inputs 41*g* are input by the user into a spreadsheet format, by way of the EXCEL® spreadsheet application or an equivalent application program executed on workstation 21.

According to an embodiment of the invention, the spreadsheet generated in process 46 includes information pertaining to the volume to be modeled, and pertaining to each of the wells in that volume, including both existing wells and also hypothetical wells, as desired for the reservoir simulation. According to this embodiment of the invention, these volume and well data include:

Volume Information:
  i. Total number of wells in the volume to be modeled.
  ii. Total number of root grid cells (RGC) in each of the x, y, z directions in the volume to be modeled.
Well Information (for Each Well to be Modeled):
  i. Total number of hydraulic fractures to be modeled.
  ii. Well orientation (vertical or horizontal).
  iii. For horizontal wells, a measured depth correction to the top of the formation containing the hydraulic fractures (i.e., correction for reference point of Kelly bushing or ground level).
  iv. Well split (i.e., number of splits to be applied to the root grid cell containing the wellbore, as shown in FIG. 2*b*), if differing from the default (e.g., 5).

The spreadsheet generated in process 46 also includes information pertaining to each hydraulic fracture at each well being modeled, to be included in the simulation. According to this embodiment of the invention, these fracture data include:

Fracture Information (for Each Fracture of Each Well):
i. Fracture orientation and shape, in the x-y plane.
ii. Fracture conductivity (md-ft.). Assumed constant within the fracture.
iii. Fracture half-length (ft.). Presumed biplanar with equal wing lengths from the wellbore.
iv. Fracture width, if differing from the default (default value being some fraction of the half-length value).
v. Fracture porosity, if differing from the default (default value being calculated from the fracture width).
vi. Fracture location along the wellbore trajectory (i.e., measured depth of the fracture for horizontal wells).
vii. Fracture split (i.e., number of splits to be applied to the root grid cell containing the fracture, as shown in FIG. 2b), if differing from the default (e.g., 9).
viii. Top and bottom zone (or top and bottom layer) that contains the fracture Of course, additional, alternative, or less information may be provided in the spreadsheet generated in process 46, as desired for the particular model. As evident from this description, several default values may be defined (either explicitly or as calculated from other values) for the wells and fractures in the modeled volume, thus reducing the extent to which user inputs are required.

As shown in FIG. 5 in connection with this embodiment of the invention, process 48 may optionally be performed to provide a "zone file" indicating the identity of various "zones" (i.e., formations, or portions of formations) in the volume to be modeled, with those zones indexed to the planes of root grid cells in the z direction of the modeled volume (into and out of the page of FIG. 2b). For example, the zone file created in process 48 may include a table of the geologic zones in the modeled volume, each zone entry associated with the vertical layers of the root grid cells containing that zone. The necessity of the zone file created in process 48 may depend on the particular simulation case (e.g., multi-stage fracing) to be executed on the model being created. Conversely, if no zone file is generated in process 48 or no layer information is provided via user inputs 41g, all fractures will be assumed to extend from the bottom layer to the top layer in the modeled volume. Fractures that are to be modeled as less than that depth can refer to the zones by name in the zone file, with the z-direction root grid cells associated with those named zones then associated with those fractures.

Once the RMS file generated by process 42, as extracted in process 44, the user input spreadsheet generated in process 46, and a zone file created in process 48 (if performed) are completed, system 20 is now ready to execute process 50 to generate an LGR gridded model for the volume to be modeled, including all specified wells and hydraulic fractures specified in the user input spreadsheet. Referring now to FIG. 6, the operation of system 20 in performing this process 50, according to embodiments of this invention, will now be described in further detail.

In this embodiment of the invention, the geologic model is created, in process 42, so that the grid of root grid cells in the x and y directions (i.e., north-south-east-west), align with the orientation of the horizontal wellbores. This constraint is typically followed in actual production fields because tight gas formations have a preferential direction of low strain, which is the preferred direction of horizontal drilling in that formation. There may be a difference in the orientation of the "simulation grid" to be used to express the locations of wellbores and fractures for LGR processing from that of the geologic model of process 42. If such is the case, the grid cell size of each simulation grid cell is recalculated, in process 61, with reference to the "RMS" geologic model orientation. In addition, the grid cell size of each LGR grid cell is determined in this process 61, with reference to the RMS model orientation. FIG. 7f illustrates an example of the simulation grid model generated in process 50 (showing only root grid cells, for clarity) and its orientation referenced to compass or true directions relative to the earth. As shown in FIG. 7f, the x- and y-directions of the two models differ from one another. Process 61 correlates or reconciles this rotation between the model coordinate systems. In addition, system 20 determines the sizes of each simulation grid cell in process 61, by calculating root-sum-square distances; for example, the length $\Delta x$ is calculated by the distance between the NW and SW points of grid cell 90:

$$\Delta x = \sqrt{(X_{NW} - X_{SW})^2 + (Y_{NW} - Y_{SW})^2 + (Z_{NW} - Z_{SW})^2}$$

while the length $\Delta y$ is calculated by the distance between the SE and SW points of that grid cell 90:

$$\Delta y = \sqrt{(X_{SE} - X_{SW})^2 + (Y_{SE} - Y_{SW})^2 + (Z_{SE} - Z_{SW})^2}$$

In process 62, a first wellbore j is selected for the application of LGR, in which the blocked well file generated in process 44 indicates the root grid cell location of wellbore j (i.e., the root grid cells within which wellbore j resides). In the example of FIGS. 2a and 2b, wellbore HWB runs along the x-direction from root grid cell $RGC_{5,0}$ to root grid cell $RGC_{5,9}$.

RGC Input data 41g is then interrogated for this wellbore j to retrieve the number of well splits (i.e., number of LGR splits within the root grid cell) for wellbore j, which may be either a default value (e.g., 5) or a user-assigned well split value. In process 63 for wellbore j, each root grid cell within which the lateral of wellbore j resides will be split, in the LGR sense, into the number of well splits indicated by input data 41g. The splits will run parallel to wellbore j itself, and will fit within the root grid cell width. The manner in which system 20 splits these root grid cells in process 63 for wellbore j is similar to that described below for orthogonal hydraulic fractures. In the alternative, if wellbore j is not orthogonal to the axes of the root grid cell grid, it is contemplated that the root grid cells may be split in a manner similar to the nested local grid refinement process for non-orthogonal fractures described below in connection with process 70.

Following wellbore split process 63, a first hydraulic fracture k associated with wellbore j is selected in process 64. System 20 then executes decision 65 to determine whether fracture k is orthogonal to the grid of root cells. It is recognized, according to this invention, that the orientation of fracture k relative to the grid will seldom, if ever, be truly orthogonal with the grid axes. As such, according to embodiments of this invention, decision 65 may be carried out by identifying a dominant angle of fracture k relative to the grid axes. That dominant angle may be a straight-line approximation of fracture k, in those cases in which the fracture path is not linear. Decision 65 then tests that dominant angle against a threshold angle value from the axes, for example as may be determined by a human analyst based on the reservoir properties, the computational capacity for carrying out the simulation, the desired resolution quality of the simulation, and the like. If the dominant angle of fracture k relative to one the axes is greater than the threshold angle value, fracture k is considered to be non-orthogonal to the grid axes (decision 65 is "no"), and processing relative to that fracture k is carried out in a nested LGR approach, as will be described below relative to process 70. System 20 may also return a "no" result in decision 65 for those cases in which fracture k is complex, such as with one or more fracture branches extending from the main fracture (which, most likely, are also not orthogonal to the grid axes).

If, on the other hand, the dominant angle of fracture k is less than the threshold angle value (decision 65 is "yes"), the grid of root grid cells in the x and y directions (i.e., north-south-east-west), is in alignment with the orientation of hydraulic fracture k. System 20 then performs process 66 for the selected hydraulic fracture k from wellbore j, to split the root grid cells within which hydraulic fracture k resides, in the LGR sense. The manner in which process 66 (and similarly, process 63) is carried out by system 20, according to an embodiment of the invention, will now be described in further detail relative to FIGS. 7a and 7b.

Process 66 begins with system 20 reading the half-length for selected fracture k from user inputs 41g in process 80. In this embodiment of the invention, it is assumed that the fracture extends for equal distances from wellbore j in either direction. The blocked well file from process 44 is interrogated by system 20 in process 82, to define the root grid cell along wellbore j from which fracture k emanates. For the example of FIGS. 2a and 2b, hydraulic fracture HF2 emanates from root grid cell $RGC_{5,4}$, with its half-length extending into the second root grid cell on either side (in the x-direction) therefrom (i.e., from root grid cell $RGC_{3,4}$ to root grid cell $RGC_{7,4}$).

Figure 7B:
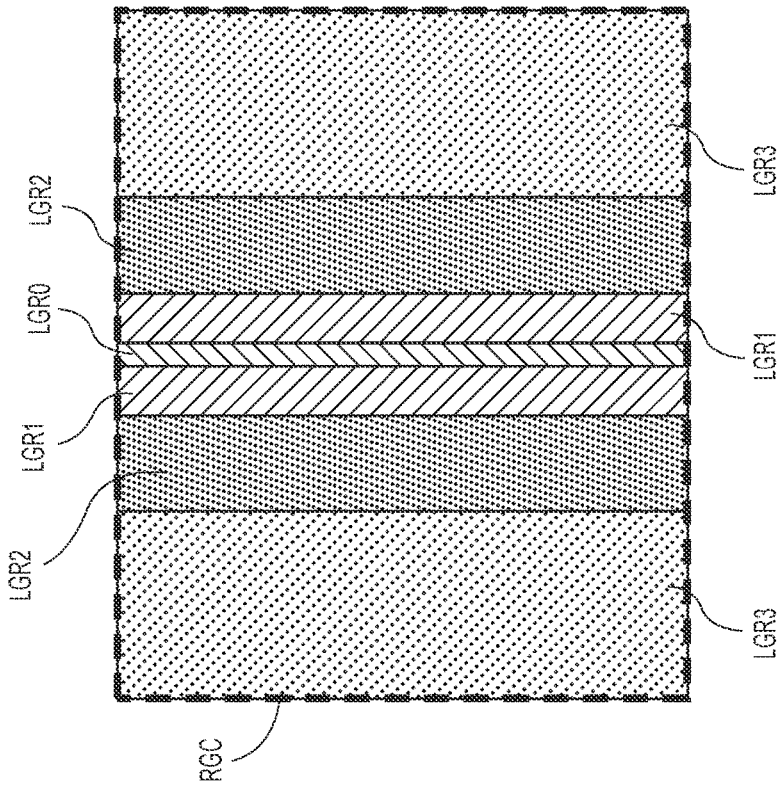
FIG. 7b is a cross-sectional plan views of a fracture location in the reservoir being modeled, illustrating the operation of embodiments of the invention.
Figure 7A:
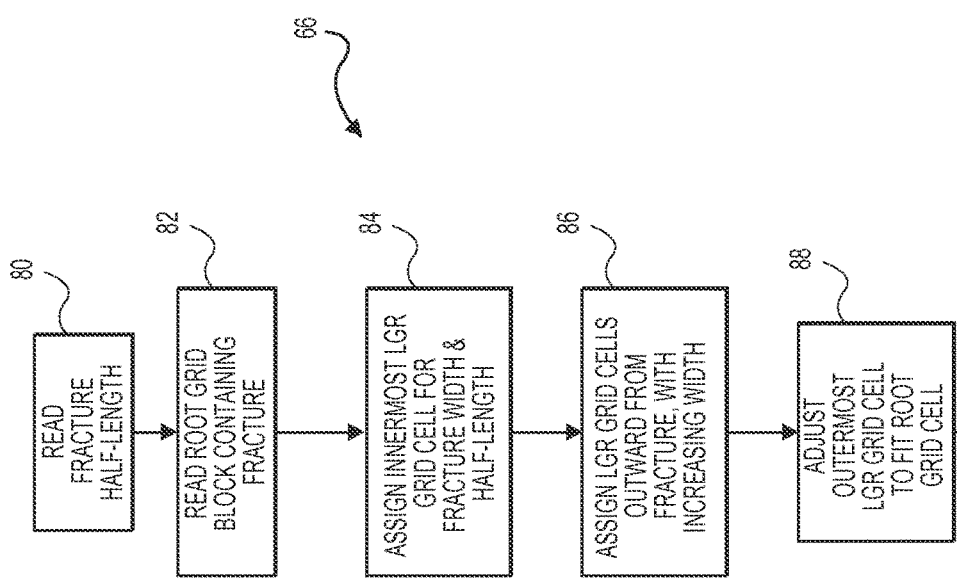
FIG. 7a is a flow diagram illustrating the operation of the system of FIG. 4 in performing LGR of root grid cells of fractures orthogonal to the grid axes of a model of a gas reservoir, according to embodiments of the invention.
Figure 8:
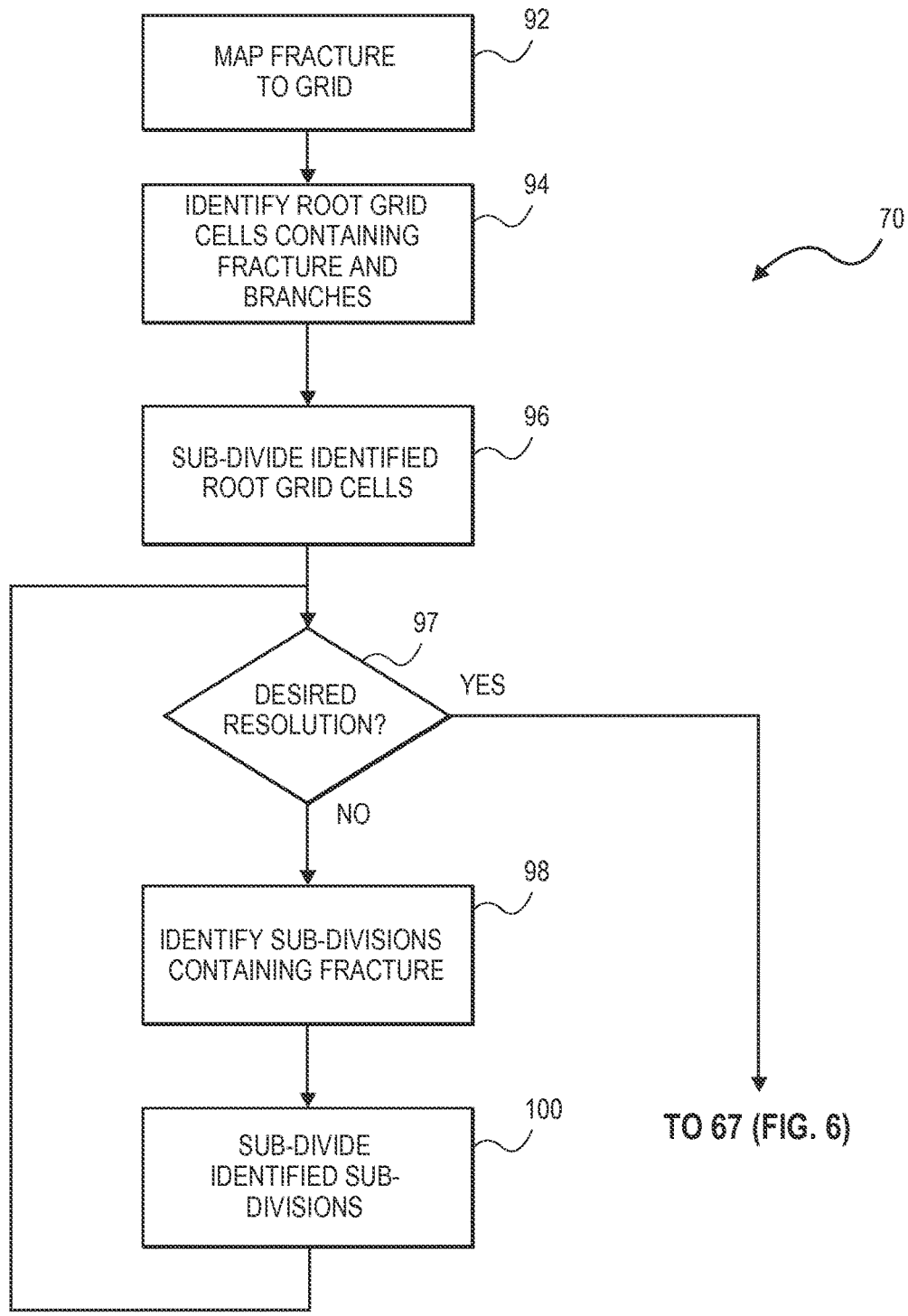
FIG. 8 is a flow diagram illustrating the operation of the system of FIG. 4 in performing nested LGR at non-orthogonal or complex fractures in the reservoir model, according to embodiments of the invention.

The splitting of these root grid cells begins in process 84, with system 20 assigning the innermost LGR grid cell to fracture k. The width of this innermost LGR grid cell may be a default value based on the fracture half-length (e.g., 0.0005 times the half-length), or may be specifically assigned in user inputs 41g. FIG. 7b illustrates an example of splitting process 66, in which innermost LGR grid cell LGR0 resides at the center of root grid cell RGC; of course, the fracture half-length may be sufficient to extend the fracture into more than one root grid cell, which will be similarly split in process 66. This innermost LGR grid cell LGR0 will be assigned the highest permeability value, as it corresponds to fracture k itself.

In process 86, system 20 assigns LGR grid cells outward from the innermost LGR grid cell corresponding to the fracture. According to embodiments of this invention, the widths of these LGR grid cells increase outwardly. For example, referring to FIG. 7b, LGR grid cells LGR1 reside adjacent to and on either side of innermost LGR grid cell LGR0, each having a width that is some multiple (e.g., two) of the width of innermost LGR grid cell LGR0. In the example of FIG. 7b, seven LGR grid cells are being applied to this fracture; as such, LGR grid cells LGR2 are assigned outwardly from LGR grid cells LGR1, and have a larger width (e.g., twice the width) of LGR grid cells LGR1, and so on. In process 88, upon the specified number of splits being assigned in process 86, system 20 adjusts the outermost LGR grid cells (e.g., grid cells LGR3 in FIG. 7b) to fit the full width of the root grid cell within which those splits reside, by extending the outer boundary of those outermost LGR grid cells to the boundary of the root grid cell. If the outer boundary of the outermost LGR grid cells are beyond the boundary of the root grid cell, system 20 issues an error message to the user, for example by prompting the user to reduce the number of splits (e.g., from seven to five).

The grids increase (e.g., double) in size out to the size of the grid block and the outermost grids are adjusted in size. A check is performed to see whether all the LGR grids fit into the original gridblock. If the total LGR splitting is bigger than the root grid block, an error message will be given to request a coarser root grid size, or a smaller splitting number (e.g. from 7 to 5 for fractures, or from 5 to 3 for wells.) Process 86 can then be repeated for the reduced split number.

As mentioned above, wellbore split process 63 is performed in a similar manner as process 66 described above in connection with FIGS. 7a and 7b.

Figure 9A:
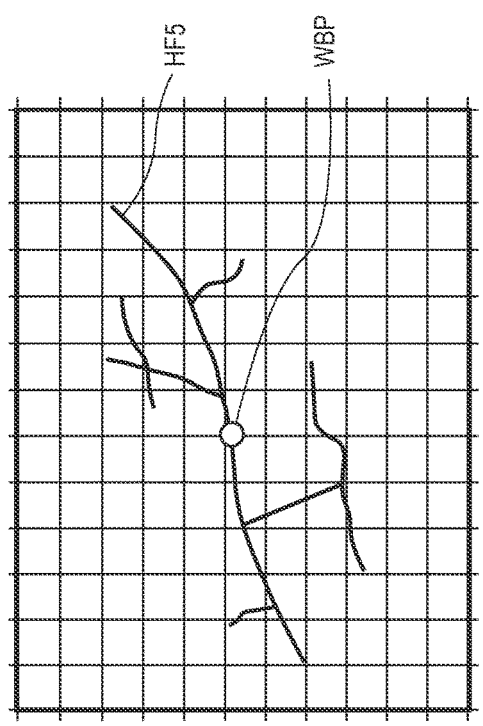
Figure 9B:
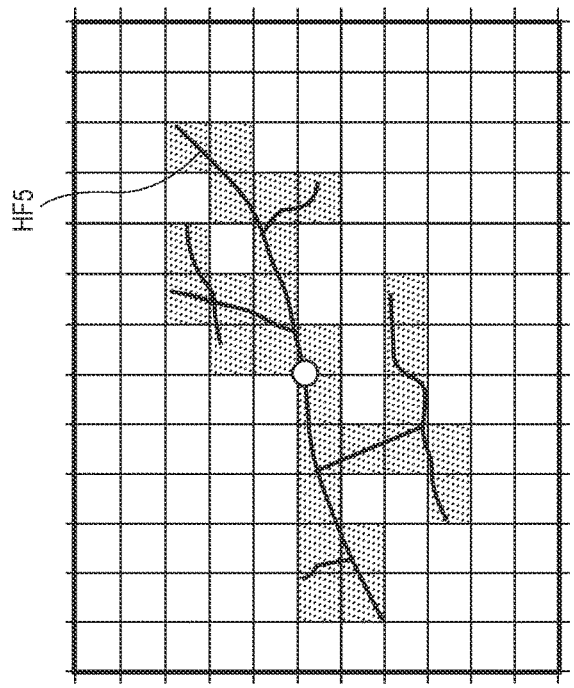

As mentioned above, nested LGR process 70 is selected for processing selected non-orthogonal or complex fracture k in response to decision 65 returning a "no" result. Referring to FIGS. 8 and 9a through 9d, nested LGR process 70 begins with process 92, in which fracture k is mapped to the grid of root grid cells $RGC_{j,k}$. FIG. 9a illustrates the result of such mapping, for the example of a complex, dendritic, fracture structure represented by hydraulic fracture HF5. As shown in FIG. 9a, hydraulic fracture HF5 is mapped to a grid of root grid cells $RGC_{j,k}$ that is representative of a region of the sub-surface. Hydraulic fracture HF5 in this example has several fracture branches extending from its main fracture, with sub-branches extending from two of those fracture branches; in addition, neither the main fracture nor the branches and sub-branches are substantially linear. The main fracture line of fracture HF5 emanates from perforation WBP of a vertical (into and out of the page of FIG. 9a) or horizontal wellbore (not shown).

In process 94, system 20 identifies those root grid cells $RGC_{j,k}$ intersected by any part of mapped hydraulic fracture HF5, including its branches and sub-branches. In the example of hydraulic fracture structure HF5, those identified root grid cells $RGC_{j,k}$ are shown as shaded in FIG. 9b.

According to this nested LGR approach, process 96 is next executed by system 20 to apply a first level of local grid refinement to those root grid cells $RGC_{j,k}$ identified in process 94. Referring to FIG. 9c for the example of hydraulic fracture HF5, those root grid cells $RGC_{j,k}$ intersected by hydraulic fracture HF5 are each sub-divided into a 2×3 array of sub-divisions, in this case two sub-divisions in the y-direction and three sub-divisions in the x-direction. The detailed view of root grid cell $RGC_{j',k'}$ in FIG. 9c illustrates this subdivision, with root grid cell $RGC_{j',k'}$ sub-divided into a top row of sub-divisions a, b, c, and a lower row of sub-divisions d, e, f. This particular (i.e., 2×3) sub-division scheme may be selected by the modeling software based on user input, or by an automated rule set applicable to the formation.

System 20 then executes decision 97 to determine whether the results of the most recent sub-division reach the desired resolution for the model. This desired resolution relates to the scale at which permeability is expected to vary near fracture k, with consideration toward the available computational resources, and may be supplied to system 20 by a user input, or determined in an automated manner from prior information regarding the formation. If the desired resolution was not attained from the prior sub-division (decision 97 is "no"), process 98 is executed by system 20 to identify those grid cell sub-divisions that are intersected by fracture k. According to embodiments of this invention, the sub-divisions identified in process 98 will be part of the root grid cells $RGC_{j,k}$ identified in process 94, but will not necessarily include the entirety of those identified cells. And in process 100, those sub-divisions identified in process 98 are then further sub-divided, into sub-sub-divisions of finer resolution. The sub-division applied in process 100 may be the same as that applied as the previous sub-division (e.g., in process 96), or may be a different sub-division scheme.

FIG. 9d illustrates the application of process 100 in a second level of nested LGR for the example of FIG. 9c. Only those sub-divisions a, b, c, d, e, f through which hydraulic fracture HF5 passes are further sub-divided in sub-division process 100, in this case in the vertical direction only. The detail of root grid cell $RGC_{j',k'}$, shown in FIG. 9d illustrates an example of this second level sub-division, with sub-division a further sub-divided into sub-sub-divisions ai, aii; sub-division b further sub-divided into sub-sub-divisions bi, bii, and sub-division c further sub-divided into sub-sub-divisions ci, cii. This sub-division in one direction only may be selected according to knowledge regarding the anisotropy of the parameters of interest, geology of the sub-surface, and the like, and contemplating the overall sub-division plan. For example, even though the previous sub-division was finer in the x-direction than in the y-direction, the sub-division in this last step only in the y-direction can provide even finer resolution than would have resulted from a 3×3 sub-division at the previous stage, without unduly increasing the number of grid cells in the model by unnecessarily sub-dividing grid cell subdivisions not impacted by fracture HF5.

Following process 100, decision 97 is again executed by system 20 to determine if the desired resolution has been attained by the smallest sub-division in the LGR processed grid (i.e., the sub-divisions formed in the previous pass of process 100). If not (decision 97 is "no"), processes 98, 100 are repeated to further sub-divide those sub-divisions intersected by fracture k. Upon reaching the desired resolution (decision 97 returns a "yes" result), control returns to decision 67 (FIG. 6).

Upon completion of root grid cell split process 66 or nested LGR process 70 for fracture k, as the case may be, system 20 determines whether additional fractures remain to be processed in decision 67. If so (decision 67 is "yes"), then the fracture index k is incremented in process 68F, with selection of this incremented fracture k in process 64, determination of its orthogonality in decision 65, and either root grid cell split process 64 or nested LGR process 70 performed for that fracture k at well bore j. Upon processing of all fractures associated with wellbore j (decision 67 is "no"), system 20 executes decision 69 to determine whether additional wells are to be processed in the volume being modeled. If so (decision 69 is "yes"), wellbore index j is incremented in process 68W, and processes 62, 63, et seq. are performed for the next wellbore to perform the LGR splitting of the root grid cells associated that wellbore j in the volume being modeled.

Upon completion of LGR processing for all fractures in all wells in the volume to be modeled (decision 69 is "no"), system 20 can perform various error checks pertaining to the model to be created. For example, in process 72, system 20 can check each of the hydraulic fractures at each of the modeled wells to determine whether any fractures overlap one another. In this embodiment of the invention, overlaps among fractures from vertical and horizontal wells are analyzed collectively to identify overlapping locations.

FIGS. 7c through 7e illustrate examples of these overlapping fractures. In FIG. 7c, two vertical wells V1, V2 are schematically illustrated, each having a single hydraulic fracture extending in the x-direction. In this example, hydraulic fracture HF1_1 extending from vertical well V1 overlaps ("OVF") hydraulic fracture HF2_1 extending from vertical well V2; each of these fractures is constrained to the horizontal (x) direction as shown. In FIG. 7d, horizontal well H2 has three hydraulic fractures HF2_1 through HF2_3, each extending from the wellbore in the y-direction. Nearby vertical well V1 in this example has hydraulic fracture HF1_1, which also runs in the y-direction, but which overlaps ("OVF") fracture HF2_1 of horizontal well H2. FIG. 7e illustrates an example of overlapping fractures from neighboring horizontal wells H2, H3. Well H2 supports hydraulic fractures HF2_1, HF2_2, HF2_3, and well H3 supports hydraulic fractures HF3_1, HF3_2, HF3_3, but formed at different spacing from one another. In this example, hydraulic fracture HF2_2 of well H2 overlaps ("OVF") hydraulic fracture HF3_2 of well H3; the other fractures exhibit no such overlap. In response to this overlapping fracture fault, system 20 may issue a warning message to the user, and may cause one of the overlapping fractures to be omitted from the output of process 50, or may manage the overlap in another appropriate manner. For example, it is contemplated that process 50 may include a routine that accommodates overlapping fractures and LGR grid cells, for example by interpolating or otherwise selecting sizes of LGR grid cells that are split in each of multiple fractures.

Upon completion of LGR for the relevant wellbores and hydraulic fractures, system 20 has thus refined root grid cells $RGC_{j,k}$ in the volume being modeled, for each wellbore and hydraulic fracture. Each of the defined LGR grid cell sub-divisions are then reconciled in the z-direction (depth within the volume), with adjustment of the depth and identification of the formation as indicated by the results of optional process 48 (FIG. 5). If desired, an additional check may be performed to ensure that the fracture as modeled is within the region defined by the output of geologic model process 42 (i.e., the RMS file).

Process 50 is then completed, in process 74, by the assigning of geologic properties to each defined grid cell, including both the root grid cells and the LGR grid cells. As mentioned above, these geologic properties include values for such parameters as porosity, permeability, water saturation, etc., particularly those properties that are of importance in the simulation of fluid flow and pressure behavior for the reservoir. As described above, those geologic properties are specified according to the geologic model created in process 42. For those grid cell sub-divisions generated for non-orthogonal and complex fractures in nested LGR process 70, a tensorial adjustment is applied to the permeability values in the manner described above. This tensorial adjustment allows conventional finite-difference simulation to be applied to the modeled sub-surface in which the fractures run obliquely to the grid axes, and also compensates for the longer distance traversed by the simulated flow in its piecewise "zig-zag" path, as described above relative to FIG. 3e. It is contemplated that those skilled in the art having reference to this description, including the above-incorporated Kasap et al. and Charfeddine et al. papers, will be readily able to incorporate such tensorial adjustment into process 74 as executed by system 20 according to embodiments of this invention.

Those skilled in the art having reference to this specification will recognize that the various processes included within LGR gridded modeling process 50 may be performed in a different order than that described in this example, or may include additional or different processes from those described. The particular sequence and arrangement of these processes can be so modified by such skilled persons, depending on the desired simulation and the particularities of the reservoir under consideration.

Referring back to FIG. 5, the results of LGR gridded modeling process 50 are then formatted for use by the relevant simulator, in process 52. Different reservoir simulation software applications and packages utilize different input data formats specifying the model of the earth to be processed. It is contemplated that those skilled in the art are familiar with the content and format of those well-known simulation input files.

System 20 then executes the desired simulation of the reservoir, using the LGR gridded model constructed according to embodiments of this invention, in process 54. Simulation process 54 typically utilizes user inputs indicating desired initial conditions from which the reservoir simulation is to begin, the parameter desired to be simulated and evaluated, and also the simulation time period over which simulation process 54 is to be performed. Embodiments of this invention enable the accurate simulation of tight gas reservoir behavior over relatively long time periods, such as months or years (i.e., usable life of the reservoir), at reasonable computational cost. Conventional modeling and simulation processes carry out such long term simulations only using coarse grid cells, but such simulation can be inaccurate in tight gas formations in which pressures can change dramatically in short distances, due to the low permeability. Conversely, conventional small grid cell sizes or conventional LGR processes may call for prohibitive computational time and complexity to carry out a long term simulation. Embodiments of this invention thus provide the ability of accurate and long term simulation of tight gas formations and reservoirs.

Depending on the desired simulation or analysis, the user can decide whether to modify the simulation to be performed (i.e., modify the initial conditions, or the simulation time frame), or the model to be simulated (i.e., insert a hypothetical well or fractures, or "shut-in" an existing well), in decision 55. If so (decision 55 is "yes"), those modifications are performed in process 56. If the desired modification of the simulation involves changing the number or locations of wells or fractures, those modifications may be made by providing new user inputs 41g to spreadsheet creation process 46, and then again creating the LGR gridded model via process 50. The ability to rapidly and efficiently created such an LGR model in an automated manner according to embodiments of this invention, such an LGR model providing good resolution without overburdening the computational capacity for the simulation, provides a modeling and simulation system that allows for interactive "what-if" analysis. It is contemplated that optimization of the reservoir exploitation plan is thus greatly facilitated by embodiments of this invention.

Although the methods described herein have been described with respect to tight gas formations, embodiments of the methods and systems may be used with any hydrocarbon formation. In addition, while this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A computer-implemented method, comprising:
providing a geologic model of a portion of earth containing a gas reservoir to be modeled, the geologic model specifying rock parameters at locations within the portion of the earth;
identifying locations of wellbores within the gas reservoir to be modeled relative to a grid, the grid defined by a plurality of root grid cells;
receiving inputs indicating one or more fracture parameters pertaining to one or more hydraulic fractures at the wellbores, the fracture parameters including at least a length of each of the one or more hydraulic fractures;
generating a Local Grid Refinement (LGR) gridded model of the portion of the earth containing the gas reservoir to be modeled by:
selectively splitting, in a first direction, each root grid cell intersected by a hydraulic fracture of the one or more hydraulic fractures into sub-divisions of increasing size from an innermost sub-division including at least a portion of the hydraulic fracture intersecting the root grid cell; and
selectively splitting a first of the plurality of root grid cells in a second direction based on the first root grid cell being intersected by one of the wellbores;
simulating fluid and pressure of the gas reservoir to be modeled using the LGR gridded model; and
controlling a production of hydrocarbons from the portion of earth containing the gas reservoir based on the simulated fluid and pressure of the gas reservoir.

2. The method of claim 1, further comprising receiving an input indicating a number of fracture splits, and wherein selectively splitting each root grid cell intersected by a hydraulic fracture of the one or more of the hydraulic fractures includes selectively splitting each root grid cell intersected by a hydraulic fracture of the one or more of the hydraulic fractures into the number of fracture splits of increasing width from an innermost LGR grid cell representing the hydraulic fracture intersecting the root grid cell.

3. The method of claim 2, wherein the first root grid cell is not intersected by any of the one or more hydraulic fractures, and wherein selectively splitting the first root grid cell in the second direction splitting the first root grid into a number of well splits of increasing width from an innermost LGR grid cell representing the one of the wellbores.

4. The method of claim 1, wherein the step of identifying the locations of wellbores comprises extracting a blocked well file from the geologic model, the blocked well file indicating root grid cells intersected by a wellbore within the gas reservoir.

5. The method of claim 1, further comprising receiving a geologic zone database specifying geological zones within the gas reservoir, with reference to the grid of root grid cells.

6. The method of claim 1, further comprising:
identifying overlapping pairs of hydraulic fractures in one or more root grid cells; and
modifying the LGR gridded model responsive to overlapping pairs of hydraulic fractures.

7. The method of claim 1, wherein generating the LGR gridded model comprises, for each of the one or more hydraulic fractures:
mapping the hydraulic fracture to the grid;
identifying root grid cells intersected by the hydraulic fracture;
sub-dividing the identified root grid cells into sub-divisions;

identifying sub-divisions intersected by the hydraulic fracture;
sub-dividing the identified sub-divisions; and
repeating the steps of identifying sub-divisions and sub-dividing the identified sub-divisions.

8. The method of claim 7, further comprising, for each of the one or more hydraulic fractures:
comparing a dominant angle of the hydraulic fracture to a threshold angle value relative to an axis of the grid; and
responsive to the dominant angle of the hydraulic fracture being less than the threshold angle value, performing the step of selectively splitting each root grid cell intersected by the hydraulic fracture.

9. The method of claim 7, further comprising after the repeating step, assigning first and second permeability values to each sub-division intersected by the hydraulic fracture, the first permeability value representing permeability in a direction parallel to a first grid axis, and the second permeability value representing permeability in a direction parallel to a second grid axis.

10. The method of claim 1 wherein the one or more hydraulic fractures comprise one or more orthogonal fractures to the wellbore, non-orthogonal fractures to the wellbore, or combinations thereof.

11. A computer system, comprising:
a processor for executing program instructions;
a memory resource, coupled to the processor, for storing data representative of a geologic model specifying rock parameters at locations within a portion of earth containing a gas reservoir, and data representative of locations of wellbores in the portion of the earth; and
program memory, coupled to the processor, for storing a computer program including program instructions that, when executed by the processor, is capable of causing the computer system to perform a sequence of operations comprising:
identifying locations of wellbores within the gas reservoir to be modeled relative to a grid, the grid defined by a plurality of root grid cells;
receiving data indicating one or more fracture parameters pertaining to one or more hydraulic fractures at the wellbores, the fracture parameters including at least a length of each of the one or more hydraulic fractures;
generating a Local Grid Refinement (LGR) gridded model of the portion of the earth containing the gas reservoir, by:
selectively splitting, in a first direction, each root grid cell intersected by a hydraulic fracture of the one or more hydraulic fractures into sub-divisions of increasing size from an innermost sub-division including at least a portion of the hydraulic fracture intersecting the root grid cell; and
selectively splitting a first of the plurality of root grid cells in a second direction based on the first root grid cell being intersected by one of the wellbores;
simulating fluid and pressure of the gas reservoir to be modeled using the LGR gridded model; and
controlling a production of hydrocarbons from the portion of earth containing the gas reservoir based on the simulated fluid and pressure of the gas reservoir.

12. The system of claim 11, wherein the sequence of operations further comprises retrieving data indicating a number of fracture splits, and data indicating a number of well splits, wherein selectively splitting each root grid cell intersected by a hydraulic fracture of the one or more hydraulic fractures includes selectively splitting each root grid cell intersected by a hydraulic fracture of the one or more hydraulic fractures into the number of fracture splits of increasing width from an innermost LGR grid cell representing the hydraulic fracture intersecting the root grid cell, and wherein selectively splitting the first root grid cell in a second direction based on the first root grid cell being intersected by one of the wellbores includes selectively splitting the first root grid cell into the number of well splits of increasing width from an innermost LGR grid cell representing the one of the wellbores intersecting the first root grid cell.

13. The system of claim 12, wherein the memory resource is also for storing data representative of a spreadsheet including data indicating the one or more fracture parameters, data indicating the number of fracture splits, and data indicating the number of well splits.

14. The system of claim 11, wherein the operation of identifying the locations of wellbores comprises retrieving, from the memory resource, a blocked well file indicating root grid cells intersected by a wellbore within the gas reservoir.

15. The system of claim 11, wherein the sequence of operations further comprises:
identifying overlapping pairs of hydraulic fractures in one or more root grid cells; and
modifying the LGR gridded model responsive to overlapping pairs of hydraulic fractures.

16. The system of claim 11, wherein the generating operation comprises, for each hydraulic fracture:
mapping the hydraulic fracture to the grid;
identifying root grid cells intersected by the hydraulic fracture;
sub-dividing the identified root grid cells into sub-divisions;
identifying sub-divisions intersected by the hydraulic fracture;
sub-dividing the identified sub-divisions; and
repeating the operations of identifying sub-divisions and sub-dividing the identified sub-divisions.

17. The system of claim 16, wherein the sequence of operations further comprises, for each hydraulic fracture:
comparing a dominant angle of the hydraulic fracture to a threshold angle value relative to an axis of the grid; and
responsive to the dominant angle of the hydraulic fracture being less than the threshold angle value, performing the operation of selectively splitting each root grid cell intersected by the hydraulic fracture.

18. The system of claim 16, wherein the sequence of operations further comprises after the repeating operation, assigning first and second permeability values to each sub-division intersected by the hydraulic fracture, the first permeability value representing permeability in a direction parallel to a first grid axis, and the second permeability value representing permeability in a direction parallel to a second grid axis.

19. A non-transitory computer-readable medium storing a computer program that, when executed on a computer system, causes the computer system to perform a sequence of operations, the sequence of operations comprising:
identifying locations of wellbores within a gas reservoir to be modeled relative to a grid, the grid defined by a plurality of root grid cells;
receiving data indicating one or more fracture parameters pertaining to one or more hydraulic fractures at the wellbores, the fracture parameters including at least a length of each of the one or more hydraulic fractures;

generating a Local Grid Refinement (LGR) gridded model of a portion of earth containing the gas reservoir by:
selectively splitting, in a first direction, each root grid cell intersected by a hydraulic fracture of the one or more hydraulic fractures into sub-divisions of increasing size from an innermost sub-division including at least a portion of the hydraulic fracture intersecting the root grid cell; and
selectively splitting a first of the plurality of root grid cells in a second direction based on the first root grid cell being intersected by one of the wellbores;

simulating fluid and pressure of the gas reservoir to be modeled using the LGR gridded model; and controlling a production of hydrocarbons from the wellbores within the gas reservoir based on the simulated fluid and pressure of the gas reservoir.

20. The computer-readable medium of claim 19, wherein the sequence of operations further comprises retrieving data indicating a number of fracture splits and data indicating a number of well splits, and wherein selectively splitting each root grid cell intersected by a hydraulic fracture of the one or more hydraulic fractures includes selectively splitting each root grid cell intersected by a hydraulic fracture of the one or more hydraulic fractures into the number of fracture splits of increasing width from an innermost LGR grid cell representing the hydraulic fracture intersecting the root grid cell, and wherein selectively splitting the first root grid cell in a second direction based on the first root grid cell being intersected by one of the wellbores includes selectively splitting the first root grid cell into the number of well splits of increasing width from an innermost LGR grid cell representing the one of the wellbores intersecting the first root grid cell.

21. The computer-readable medium of claim 19, wherein the sequence of operations further comprises:
identifying overlapping pairs of hydraulic fractures in one or more root grid cells; and
modifying the LGR gridded model responsive to overlapping pairs of hydraulic fractures.

22. The computer-readable medium of claim 19, wherein the generating operation comprises, for each hydraulic fracture:
mapping the hydraulic fracture to the grid;
identifying root grid cells intersected by the hydraulic fracture;
sub-dividing the identified root grid cells into sub-divisions;
identifying sub-divisions intersected by the hydraulic fracture;
sub-dividing the identified sub-divisions; and
repeating the operations of identifying sub-divisions and sub-dividing the identified sub-divisions.

23. The computer-readable medium of claim 22, wherein the sequence of operations further comprises, for each hydraulic fracture:
comparing a dominant angle of the hydraulic fracture to a threshold angle value relative to an axis of the grid; and
responsive to the dominant angle of the hydraulic fracture being less than the threshold angle value, performing the operation of selectively splitting each root grid cell intersected by the hydraulic fracture.

24. The computer-readable medium of claim 19 wherein the one or more hydraulic fractures comprise one or more orthogonal fractures to the wellbore and one or more non-orthogonal fractures to the wellbore.

25. The computer-readable medium of claim 24, wherein root grid cells that are intersected by the one or more orthogonal fractures are sub-divided using a different gridding technique than root grid cells that are intersected by the one or more non-orthogonal fractures.

26. The computer-readable medium of claim 25, wherein the root grid cells that are intersected by the one or more orthogonal fractures are sub-divided using grid lines parallel to the one or more orthogonal fractures, and wherein the root grid cells that are intersected by the one or more orthogonal fractures are sub-divided by dividing the root grid cells that are intersected by the one or more non-orthogonal fractures into first quadrants and dividing quadrants of the first quadrants that are intersected by the one or more non-orthogonal fractures into sub-quadrants.

* * * * *